US008582266B2

(12) United States Patent
Bertin et al.

(10) Patent No.: US 8,582,266 B2
(45) Date of Patent: Nov. 12, 2013

(54) CURRENT-MONITORING APPARATUS

(75) Inventors: Jacques J. Bertin, Pocatello, ID (US); Stefan Van Roeyen, Sint-Niklaas (BE); Alexis Huot-Marchand, Saint Caprais de Bordeaux (FR); Koen Geirnaert, Knesselare (BE); Johan Janssens, Asse (BE); Christophe Gouwy, Renaix (BE); Joannes Mathilda Josephus Sevenhans, Prins Kavellei (BE)

(73) Assignee: Broadcom Corporation, Irvine, CA (US)

( * ) Notice: Subject to any disclaimer, the term of this patent is extended or adjusted under 35 U.S.C. 154(b) by 806 days.

(21) Appl. No.: 11/676,252

(22) Filed: Feb. 16, 2007

(65) Prior Publication Data

US 2007/0296391 A1    Dec. 27, 2007

Related U.S. Application Data

(63) Continuation-in-part of application No. 11/356,557, filed on Feb. 17, 2006, now Pat. No. 7,525,333.

(30) Foreign Application Priority Data

Aug. 31, 2006  (EP) ..................................... 06447102

(51) Int. Cl.
    *H02H 5/04*    (2006.01)
(52) U.S. Cl.
    USPC ....................................................... 361/93.8
(58) Field of Classification Search
    USPC ........ 361/93.1, 93.8, 103, 106; 713/320, 323, 713/330
    See application file for complete search history.

(56) References Cited

U.S. PATENT DOCUMENTS

| 4,854,731 | A | * | 8/1989 | Jenkins | ......................... 374/178 |
| 5,220,207 | A | | 6/1993 | Kovalcik et al. | .............. 307/350 |
| 6,465,999 | B2 | | 10/2002 | D'Angelo | |
| 6,700,365 | B2 | | 3/2004 | Isham et al. | |
| 6,765,412 | B1 | | 7/2004 | Schottler et al. | |

(Continued)

FOREIGN PATENT DOCUMENTS

| EP | 1545050 A2 | 6/2005 |
| WO | WO03/088426 | 10/2003 |
| WO | WO2005/071885 | 8/2005 |

OTHER PUBLICATIONS

Linear Technology, Datasheet for LTC4257, 2003, Linear Technology, 1-20.*

(Continued)

*Primary Examiner* — Jue Zhang
(74) *Attorney, Agent, or Firm* — Sterne, Kessler, Goldstein & Fox P.L.L.C.

(57) ABSTRACT

A local area networking apparatus comprises a power stage for connecting to a network cable for carrying carry power and data. The power stage comprises a main current flow path which includes a switch comprising at least one transistor positioned in the main current flow path and a current monitoring apparatus for monitoring current flow in the main current flow path, and wherein the current monitoring apparatus comprises a sensor which is not placed in series with the main current flow path. The current monitoring apparatus can comprise a current mirroring stage which is arranged to mirror current flowing in the main current flow path to a monitoring current flow path. The switch can be implemented as a set of switches.

16 Claims, 13 Drawing Sheets

(56) References Cited

U.S. PATENT DOCUMENTS

| | | |
|---|---|---|
| 7,525,333 B1 | 4/2009 | Bertin |
| 2003/0099076 A1 | 5/2003 | Elkayam et al. |
| 2004/0236967 A1 | 11/2004 | Korcharz et al. ............. 713/300 |
| 2005/0122140 A1 | 6/2005 | Peker et al. .................. 327/108 |
| 2006/0143488 A1* | 6/2006 | Peleg et al. .................. 713/330 |
| 2007/0082550 A1* | 4/2007 | Hemmah et al. ............. 439/607 |
| 2009/0066404 A1* | 3/2009 | Heppenstall et al. ......... 327/513 |

OTHER PUBLICATIONS

Partial European Search Report Date of completion: Jun. 22, 2009 Place of Search: The Hague (4 pages).

Official Communication Extended Search Report; Application 07003399.9-1244/1821451 dated Sep. 24, 2009.

Non-Final Rejection mailed Mar. 17, 2008 for U.S. Appl. No. 11/356,557, filed Feb. 17, 2006; 15 pages.

Notice of Allowance mailed Dec. 16, 2008 for U.S. Appl. No. 11/356,557, filed Feb. 17, 2006; 14 pages.

* cited by examiner

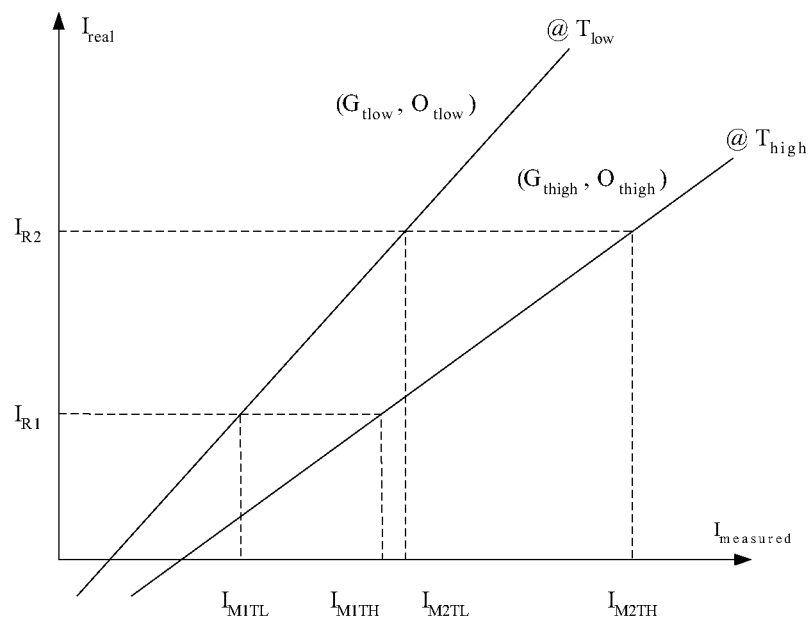
Fig. 12
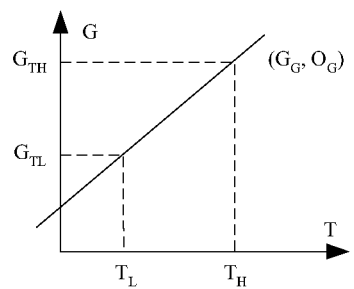
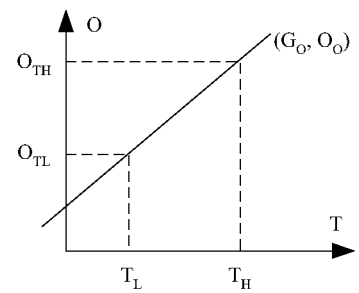
Fig. 13  Fig. 14

CURRENT-MONITORING APPARATUS

CROSS-REFERENCE TO RELATED APPLICATIONS

This patent application claims priority under 35 U.S.C. 119 to European patent application serial number 06447102.2 filed Aug. 31, 2006, which European patent application is incorporated hereinto by reference in its entirety. This patent application is also a continuation-in-part of U.S. patent application Ser. No. 11/356,557 filed Feb. 17, 2006, now U.S. Pat. No. 7,525,333 which United States patent application is also incorporated herein by reference in its entirety.

BACKGROUND OF THE INVENTION

The Field of the Invention

There are various occasions where it is necessary to monitor an amount of current that flows along a path. One example is where current is supplied to a load via a switch. By measuring the current, the current may be regulated to an appropriate value, such as a static current value or a dynamic current value that varies in response to dynamic circumstances. In the example of a low ohmic switch connected to an external load, it is often desirable to have over-current protection to prevent circuit damage in case of overload. In addition to over-current protection, it is also desirable to limit and/or measure the current flowing through the switch. Such types of circuits can be used in Power over Ethernet (PoE) applications as discussed more fully below.

FIG. 1 illustrates one conventional current sense circuit 100 in which a resistor 101 having resistance $R_{SENSE}$ is inserted in series with a switch 102 whose current is being measured. Neglecting any current leakage due to the operational amplifier 103, the current passing through the switch 102 also passes through the sense resistor 101. Thus, the voltage $V_{SENSE}$ at the positive input terminal of operational amplifier 103 is proportional to the current passing through the switch 102. The operational amplifier 103, transistor 105 and resistor 106 configured as shown cause the voltage at the upper terminal of the resistor 106 to be roughly equal to the voltage V at the upper terminal of the resistor 101. Thus, the current $I_{SENSE}$ that passes through the switch 105 and resistor 106 is approximately proportional to the current passing through the switch 102, thereby sensing the current passing through the switch 102.

One difficulty with the conventional current sense circuit 100 is that it uses the sense resistor 101. If the sense resistor 101 is large, the sense circuit 100 has high power dissipation, which increases the costs of using the circuit, potentially decreases its lifetime, and also can contribute to heat dissipation challenges. If the resistance of the sense resistor 101 is too low, the voltage V will be too low to gain an accurate current measurement.

U.S. Pat. No. 5,220,207 describes a load current monitor for a MOS driver, which is shown in FIG. 2. Current I through a switch 240 (also referred to as "transistor 240") is measured. The current sense circuit 200 permits current sensing without the use of an explicit resistor in the main current flow path. Here, a mirror transistor 248 is used to generate a mirror current I that is approximately proportional to the current I through the switch 240. Factoring in the size ratio of the transistors 240 and 248, the current I through the switch 240 may then be calculated based on the mirror current I. In order to support this mirroring, the voltages at the gate terminals of transistors 240 and 248 should be the same, the voltages at the source terminals of transistors 240 and 248 should be the same, and the voltages at the drain terminals of transistors 240 and 248 should be the same. This is accomplished by tying the gate terminals together, and by tying the source terminals together. The drain terminals are kept at the same voltage using the operational amplifier 256 configured with feedback provided through transistor 252 as shown.

One problem with the reliability of current sensing circuits, such as the one shown in U.S. Pat. No. 5,220,207, is that the circuits will inevitably include 'implicit resistances' which arise from metallization within a device, and in the leads to/from a device. For example, the terminals of a transistor are connected to the rest of the circuitry using a conductive material that will have some finite resistance. Similarly, the voltages provided to the current sense circuit pass through bond wires and internal conductive material as well. Such metallization resistance may be neglected in many cases. For example, in FIG. 2, the metallization resistance may be neglected if the current is not above certain levels. However, as the currents rise, so do the Joule heating losses due to the implicit metallization resistances. These Joule heating losses may cause the source voltages of transistors 240 and 248 to differ even though they are shown coupled in FIG. 2 due to the presence of perhaps different implicit resistances between the source terminals and the low voltage supply. Similarly, the drain voltages may likewise be different due to different implicit metallization resistance experienced in each current path. At some current levels, the mirroring function may break down, resulting in inaccurate current sense operation.

Power over Ethernet (PoE) is the ability for a network such as LAN switching infrastructures to provide power over a copper Ethernet cable to an endpoint known as a Powered Device. This capability, once referred to as "inline power", was originally developed and first delivered by known providers of Ethernet solutions in 2000 to support the emerging IP Telephony deployments. IP Telephones, like desktop PBX phones, need power for their operation and Power over Ethernet enables scalable and manageable power delivery and simplifies deployments of IP Telephony. As Wireless networking emerged, Power over Ethernet was also used to power these devices to allow for deployments in locations where local power access did not exist. While IP telephones and wireless access points are the most intuitive uses for PoE, the advent of 802.3af standardization of PoE opens the door to a new generation of networked-attached devices such as video cameras, point-of-sale devices, security access control (card scanners), building automation and industrial automation just to name a few. As seen in FIG. 3, a PoE solution typically comprises a Power Sourcing Equipment (PSE) and one or more Powered Devices (PD) linked by an Ethernet cable 330 and connectors 340. A typical PSE device includes a mixed signal control section 310 and a power section 320. The power section 320 includes a power switch 321 and a current sensing device 322. The power switch can be implemented by a MOSFET transistor, a bipolar transistor, a relay or other device. If the PSE device is integrated, the power switch will preferentially be a power MOSFET (e.g. DMOS) or a bipolar transistor integrated in the same semiconductor substrate as the control section 310.

The power switch 321 controls the amount of current supplied to the load or PD 350 based on information from the current sensing device 322. The power switch can also serve a protection purpose by limiting the current drawn by the load and, if necessary, disconnecting the load in case of an overload or a short circuit. From these examples, it is apparent that practical implementation of Power over Ethernet relies on proper operation of the current sensor. In normal operation, this sensor should have as little impact on the rest of the PoE system as possible.

Several semiconductor manufacturers offer integrated circuit that will operate in a PSE or will serve as, or be part of, a PD interface. In a PSE, the role of such integrated circuits will be to deliver power to one or more Powered Devices connected to an Ethernet/LAN network. To do so in an IEEE 802.3af compliant way, these circuits must provide among other things current measurement and current limitation as discussed earlier. Power will be delivered by a PSE to a PD conditionally through a transistor switch. By switching the transistor switch ON (i.e. the transistor switch is closed), power will be granted to the PD/PD interface.) By switching the transistor switch OFF (i.e. the transistor switch is open), power is denied to the PD/PD interface. Power will be granted or denied to a PD/PD interface based on a set of conditions, which include the amount of current sunk by the PD/PD interface). This requires that the current sunk by the PD/PD interface is measured with some precision.

In a PD interface, the integrated circuit will, among other things, (a) convert the DC level available through the Ethernet connection to a DC level compatible with the device to be powered (b) deny or grant power to the DC-DC converter that powers the PD by opening or closing a transistor switch. Denial of power to the DC-DC converter is based on the detection of fault conditions. For example such a fault condition might be an excessive current sunk by the DC-DC converter. This requires a precise enough measure of the current sunk by the DC-DC converter.

Today, both in PSE and PD interfaces, current is measured by means of a sense resistor serially connected to the power MOSFET. In order to limit the power dissipated in the sense resistor, the value of the sense resistor must be very low, usually less than 1Ω (typically 0.1Ω). Examples of integrated circuits integrating most of the function of a PSE or PD interface are the MAX5922 (PSE device) from MAXIM (see MAXIM datasheet 19-2708; Rev0; 4/03), the LM5072 from National Semiconductor (see National Semiconductor datasheet DS201846 from March 2006), the MAX5942A/MAX5942B (PD Interface) from MAXIM (see MAXIM datasheet 19-3024; Rev 2; 9/04), the LTC4267 from Linear Technology (PD Interface), the Si3400 from Silicon Laboratories (see Silicon Laboratories datasheet Si3400 Rev. 0.3 6/06). Each of these integrated circuits rely on a sense resistor to measure the current flowing through the transistor switch, or switches, used to grant or deny current to a PD or a PD interface.

In US20050122140A1, both the Power Sourcing Equipment and the Powered Device Interface rely explicitly on sense resistors serially connected to the switch controlling current flow for current measurement. In US20040236967A1, the power sourcing equipment relies on a sense resistor not only to measure the current flowing through the power switch that is used to grant or deny power to a PSE/PD Interface but also to interrupt. WO 2005/071885 and WO 03/088426 A1 also show PoE equipment which use current sensing resistors.

Existing Power over Ethernet equipment exclusively uses a sense resistor positioned in series with the main current flow path to sense current flow. Emerging applications will require more current to be transferred to a Powered Device. Surprisingly, in spite of the substantial amount of information related to current measurement, no Power over Ethernet equipment provides an alternative to the sense resistor as a mean to measure the current flowing through the power switch of PSE and PD devices.

A further problem of existing Power over Ethernet equipment is a risk of overheating.

BRIEF SUMMARY OF THE INVENTION

The present invention seeks to reduce or overcome at least one of the problems of the prior art apparatus.

A first aspect of the present invention provides a power supply apparatus for connecting to cable which carries power and data, the power supply apparatus comprising a main current flow path which includes a switch comprising at least one transistor positioned in the main current flow path and a current monitoring apparatus for monitoring current flow in the main current flow path, and wherein the current monitoring apparatus comprises a sensor which is not placed in series with the main current flow path. The cable can be a shared resource network cable such as a local area network, a telephone cable, etc.

Avoiding the use of a current sense resistor has a significant advantage in reducing the amount of power dissipated in the power stage, which can for example reduce problems of overheating that can lead to catastrophic failure of integrated circuits. This improves reliability of the power supply apparatus. As an example, of a sensing device that is not placed in series with the main current flow path, the current monitoring apparatus preferably comprises a current mirroring stage which is arranged to mirror current flowing in the main current flow path to a monitoring current flow path. Applicant has recognized, after a substantial amount of experimentation and validation, that a current mirror structure including the power switch of a PSE or a PD interface device is adequate to measure the current delivered by the PSE device or used by a PD/PD interface device with sufficient precision.

The power supply apparatus can be used as part of a Power Sourcing Equipment (PSE) or a Powered Device (PD) for use in a Power over Ethernet (PoE) system, such as (but not limited to) a system which conforms to IEEE 802.3af. The PSE and PD can be external adaptors which just provide power into and out of an Ethernet cable, or they can be incorporated within a local area networking apparatus which processes data.

A further problem of implementing a current mirror in such apparatus is that the switch is effectively a 'floating switch', in that neither of the nodes of the switch through which current is flowing are connected to a fixed, reference potential. Dependent claims recite features which overcome this problem, and which improve the precision of the current mirror to allow its use as a current sensor in the power supply apparatus.

The current monitoring apparatus preferably comprises a plurality of constituent transistors (such as FETs). The source terminals of the multiple constituent transistors are coupled together; the drain terminals of the multiple constituent transistors are coupled together; and the gate terminals of the multiple constituent field-effect transistors are coupled together. The current sense circuit is designed to measure the current through the switch by using a mirror current branch. The mirror current branch includes a mirror transistor. Due to implicit resistances between the constituent transistors and the power sources, and amongst the constituent transistors themselves, the drain and source voltages of the constituent transistors may not be the same, even if coupled in parallel between the high and low voltage rails. For instance, such implicit resistance may be due to metallization. Such metallization resistance Rm may result in significant variances in drain and source voltages of the constituent switch transistors. The current monitoring apparatus provides a more accurate measure of current through the switch by applying voltages at the source and/or drain terminals of the mirror transistor that more closely approximate the average source and drain terminals of the constituent field-effect transistors of the switch. Thus, relatively accurate switch current measurements may be obtained.

The improvements to the operation of using the current mirror as described with reference to the present invention can be applied to apparatus in other areas (i.e. not limited to a power supply apparatus for connecting to a local area networking cable).

Preferably, the current monitoring apparatus further comprises a temperature sensor for sensing operating temperature of the apparatus, a store of calibration data and control logic arranged to adjust the measured current according to the calibration data. The calibration data can comprise measurement data obtained during a production test, which represents values for at least one measured quantity at two different operating temperatures. The calibration data can comprise a correspondence between a value of a test current and a value of a measured current at least two values of test current, at two different operating temperatures.

This aspect of the invention provides simpler and more efficient calibration of the current sensors that are affected by the temperature variations that accompany the varying level of power/current delivered by power switches. While the current is preferably measured using the current monitoring apparatus as described in the first aspect of the present invention, this aspect of the invention can also provide an advantage when current is measured using a conventional, series positioned, current sense resistor.

In another aspect the present invention also provides a current monitoring apparatus comprising:

a main current flow path between a first terminal and a second terminal;

a switch comprising at least one transistor positioned in the main current flow path;

a current mirroring stage arranged to mirror current flowing in the main current flow path to a monitoring current flow path;

wherein the current mirroring stage comprises:
 a mirror transistor positioned in the monitoring current flow path;
 a first voltage setting stage for setting the voltage at a first side of the mirror transistor equal to the voltage at a first side of the switch;
 a second voltage setting stage for setting the voltage at a second side of the mirror transistor equal to the voltage at a second side of the switch. The switch may comprise a plurality of transistors arranged in parallel with one another and wherein:
 the first voltage setting stage is arranged to set the voltage at the first side of the mirror transistor equal to a function of the voltages at individual ones of the plurality of transistors, and
 the second voltage setting stage is arranged to set the voltage at the second side of the mirror transistor equal to a function of the voltages at individual ones of the plurality of transistors.

Preferably, each of the voltage setting stages is arranged to set the voltage equal to a function of the voltages at a sub-set of the plurality of transistors.

Each of the voltage setting stages may be arranged to set the voltage equal to a function of the voltages at all of the plurality of transistors. The function is preferably an average value of the voltages at individual ones of the transistors.

Each of the voltage setting stages may comprise a network of sense resistors which connects to respective ones of the transistors. For example, the first voltage setting stage may comprise an operational amplifier and a source follower transistor positioned in series with the mirror transistor, the amplifier having a non-inverting input connected to the first side of the switch, an output connected to the gate of the source follower transistor and an inverting input connected to the source of the source follower transistor. The second voltage setting device may comprise an operational amplifier having a non-inverting input connected to the second side of the switch, an output connected to the source of the mirror transistor and an inverting input connected to the source of the mirror transistor.

Additional components may be added, e.g. a detector may be provided for measuring an amount of current flowing in the monitoring current path. A temperature sensor may be provided for sensing operating temperature of the apparatus. A store of calibration data may be provided and control logic being arranged to adjust the measured current according to the calibration data. The calibration data may comprise measurement data obtained during a production test, which represents values for at least one measured quantity at two different operating temperatures. Also, the calibration data may comprise a correspondence between a value of a test current and a value of a measured current at, at least, two values of test current, at two different operating temperatures.

The detector may be any suitable type of detector, and may include, for example, an analog-to-digital converter and the calibration data may include data for at least one of: gain and offset of the converter with varying temperature.

A further aspect of the present invention provides a power supply apparatus comprising:
 a substrate;
 at least one power switch mounted on, or integrated with, the substrate, the switch comprising a temperature sensor positioned locally to the switch for locally sensing temperature of the switch and a regulator for controlling the switch based on the locally sensed temperature;
 a further temperature sensor positioned on the substrate for sensing to an overall temperature of the substrate;
 a controller for regulating current flow through the switch which is responsive to the further temperature sensor.

The power supply apparatus can be an integrated device, with the power switch, temperature sensors and controller all integrated on the same semiconductor substrate, or the substrate can comprise a circuit board on which the devices are mounted.

While temperature is usually considered as (almost) constant across a semiconductor substrate it has been found that this approximation only holds for circuits that will not dissipate power excessively. In power applications, it has been found that the high level of power dissipated in the switches integrated in the substrate can cause significant temperature differences across the semiconductor substrate.

This aspect of the invention is particularly useful when applied to a power supply which has multiple switches, each having a locally positioned temperature sensor. Using a temperature sensor local to the switch, rather than a single general temperature sensor, allows continued operation of the remaining 'cold' switches and reduces the current and power only in the 'hot' switch.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 12 shows relationship between measured and real current at different operating temperatures;

FIGS. 13 and 14 show relationships between amplifier gain and offset with varying temperature;

DETAILED DESCRIPTION OF THE PREFERRED EMBODIMENTS

Figure 1:
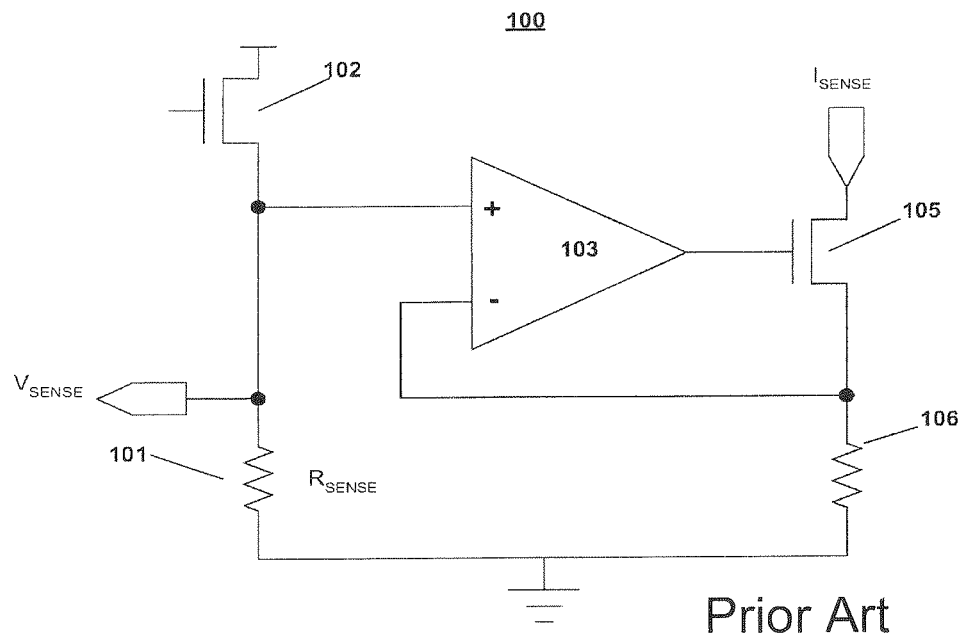
FIG. 1 shows a known way of monitoring current flowing through a switch.
Figure 2:
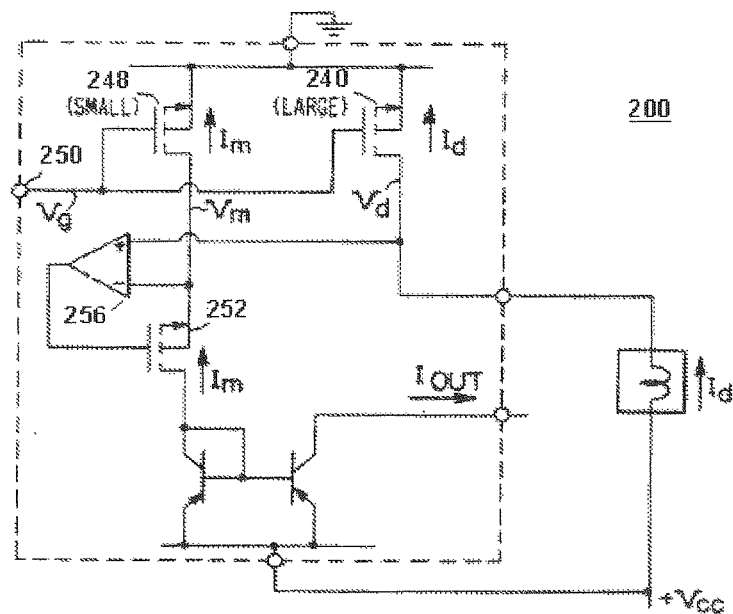
FIG. 2 shows an alternative known way of monitoring current flowing through a switch.
Figure 3:
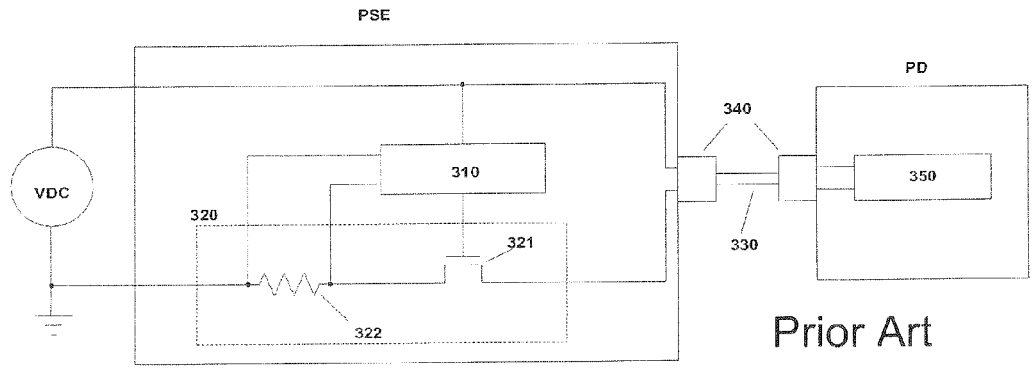
FIG. 3 shows Power over Ethernet (PoE) system in which current flow is monitored by a sense resistor.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The present invention can find advantageous use in any power supply application, e.g. DC power supply over cables such as telephone cables. The present invention will mainly be described with reference to providing power over a shared resource network of which an Ethernet network is only an example (Power over Ethernet or PoE). The topology of the network is not considered to be a limitation on the present invention, e.g. star, bus, token ring topologies, etc. The word "equipment" should be interpreted broadly. For example, the power sourcing equipment (PSE) can be a stand-alone device for attachment to a network or may be included in another device attached to the network, e.g. in network components such as hubs, switches, routers, wireless base stations, wireless outlets, wireless access points, printer servers, PBX's as well as in any other peripheral equipment such as data units, digital terminal equipment, wired or wireless telephones, computers, displays, projectors, printers, etc. The power sourcing equipment (PSE) may also be, or may be included in, an electronic component such as on an insertable card or board such as a Printed Circuit Board (PC) for insertion in any electronic device or as an Integrated Circuit. The electronic component may include an IC (see below), connectors, and passive components such as capacitors, . . . . A power supply may be provided from external, e.g. from the host device which is to receive the electronic component or may be integrated on the electronic component. The electronic component may also include voltage transformation devices, e.g. to receive a AC voltage from an external supply and to transform this to the required voltage with additional rectifier circuits and optionally smoothing circuits to generate the final DC voltage required by the PoE application. The power sourcing equipment (PSE) may also be implemented as an integrated circuit or an integrated circuit module.

Figure 4:
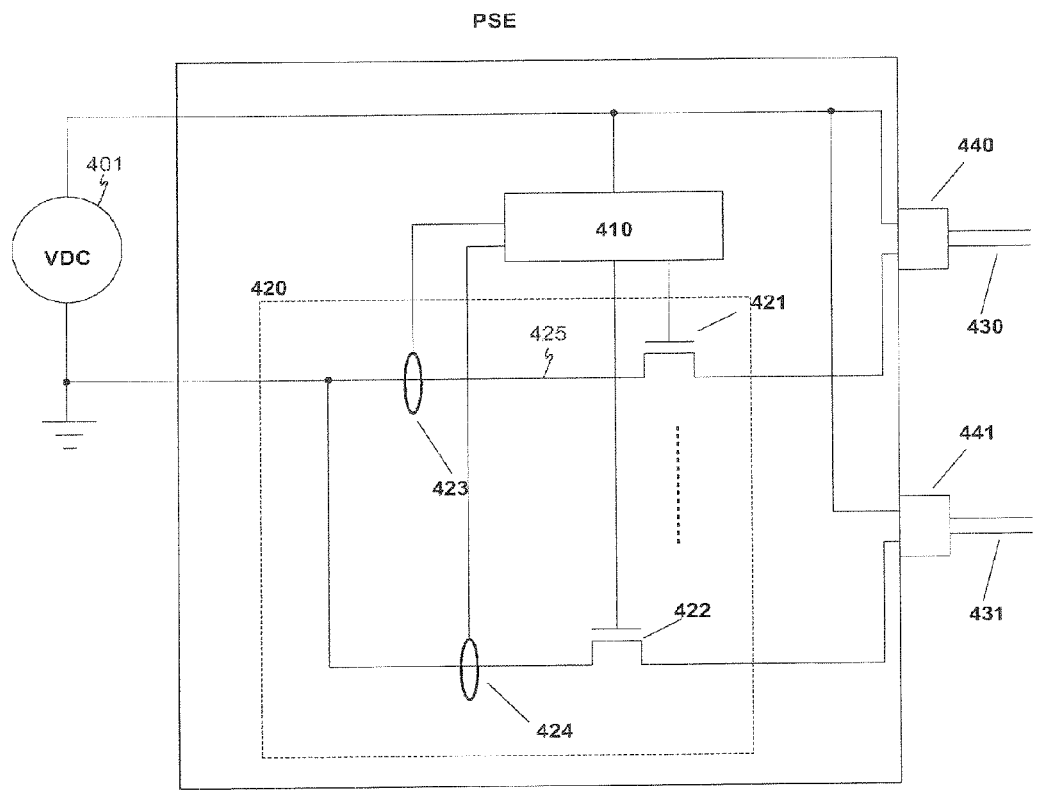
FIG. 4 shows a Power Sourcing Equipment (PSE) for Power over Ethernet (PoE) system comprising a set of power switches for serving multiple loads.
Figure 5:
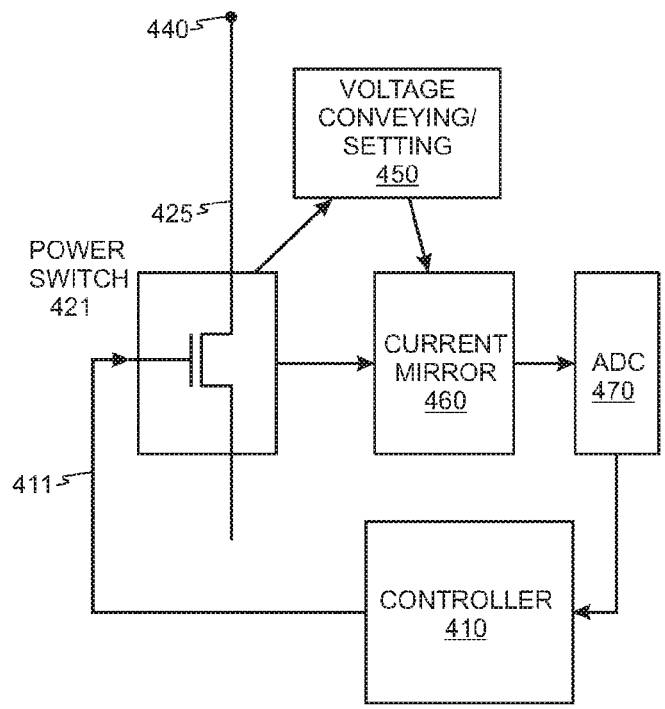
FIG. 5 shows an overview of a current monitoring apparatus in accordance with an embodiment of the present invention.

FIGS. 4 and 5 give an overview of an apparatus in accordance with an embodiment of the invention. FIG. 4 schematically shows a Power Sourcing Equipment (PSE) which can be used to supply power to a Powered Device (PD) via shared resource network cabling such as a local area networking cable, e.g. in accordance with IEEE 802.3af. The Powered Devices (PD) can be any device attached to the network that needs to be powered, e.g. network components such as hubs, switches, routers, repeaters, wireless base stations, wireless outlets, wireless access points, printer servers, PBX's as well as in any other peripheral equipment such as data units, digital terminal equipment, telephones, computers, displays, projectors, printers, battery chargers, docking stations, etc. The PD may also be, or may be included in, an electronic component such as on an insertable card or board such as a Printed Circuit Board (PC) for insertion in any electronic device. The PD may also be implemented as an integrated circuit or an integrated circuit module.

A PSE according to an embodiment of the present invention can supply a single output port 440 or, as shown in FIG. 4, multiple output ports 440, 441. Each output port can connect to a single PD, or a group of PDs. Power is supplied from a power supply 401 (typically 48V DC) to an output port 440 via a current path which includes a power switch 421 positioned in series with the current path. A sensor 423 senses current flow in the current path. In accordance with the present invention, current flow is sensed in a manner which does not require a sensing resistor to be positioned in series with the current flow path, such as a current mirror. A controller is responsive to the sensor 423 and controls switch 421. Each port 440, 441 of the PSE can connect to a Powered Device via a network cable 430, 431, such as a twisted pair cable. Power can be carried over spare wires of the cable (i.e. wires not carrying data) or can be carried over the same wires as data in a manner which is known. Although FIG. 4 shows a PSE, similar apparatus is provided in a Powered Device (PD). A Powered Device typically also includes a DC-DC converter to convert the 48 VDC supply to a voltage which is useful to the Powered Device.

FIG. 5 shows an embodiment of the current monitoring apparatus in more detail. A power switch 421 is positioned in series with a current path 425 to a load connectable to or connected to output terminal 440. The power switch has a control electrode, e.g. a gate of a transistor which allows the switch to be activated, i.e. opened or closed. In use, current flowing along path 425 is mirrored to a second circuit branch (which will be called a mirrored branch) by use of a current mirror stage 460. The mirrored branch includes a mirror transistor. A voltage conveying/setting stage 450 improves the accuracy of the current mirror 460, by setting voltages at each side of the current mirror transistor 460, or by ensuring voltages across terminals of the current mirror transistor match the voltages across corresponding terminals of the power switch 420. Current flowing in the mirrored branch 460 is measured by any suitable device, e.g. an ADC. The ADC can operate in the current domain and can directly measure current flow in the mirrored branch. Alternatively, the ADC can operate in the voltage domain, in which case current flow in the mirrored branch is converted to a measurable voltage by, for example, passing current in the mirrored branch through a resistance of known value and measuring voltage across the resistance. The measured current is applied to a controller 410. Controller 410 monitors the measured current and uses control logic to decide when the current goes beyond an allowable value, e.g. exceeds a permitted limit such as an over-current or under-current situation. Controller 410 can control the operation of the power switch 420 e.g. by means of current path 411 to the control electrode, e.g. a gate, of the power switch, causing the power switch to turn on thus allowing current to flow along path 425 or off by preventing current from flowing along path 425. As described more fully below, the controller 410 can also respond to an input received from another sensor such as an environmental sensor, e.g. a temperature sensor integrated with the switch 420. The temperature sensor indicates the operating temperature of the switch, and can control the switch 420 based on temperature.

Figure 6:
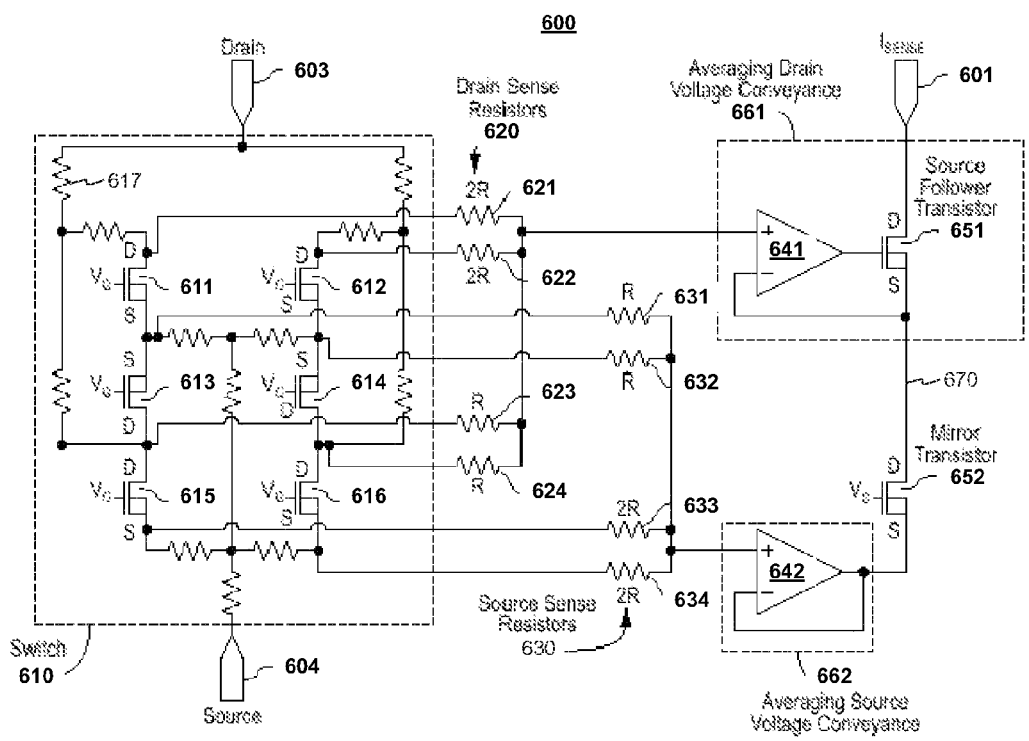
FIG. 6 shows the current monitoring apparatus of FIG. 5 in more detail, with a power switch comprising multiple transistors.

FIG. 6 illustrates, in more detail, a first embodiment of a current sense circuit 600 in which the current flowing through a switch 610 may be measured. In this embodiment, switch 610 is realized as a multi-transistor switch comprising a set of transistors 611-616, with each transistor being configured in parallel between a first main terminal (collective drain terminal 603) and a second main terminal (collective source terminal 604). Each of the transistors 611-616 will be referred to as a "constituent transistor". All of the switches 611-616 are operated together, and receive the same control signal $V_G$. The reason for the switch to be split into a set of constituent switches is to achieve a very well determined ratio between the size (width W and length L) of the switch and the mirror transistor. Ideally, the ratio of the current in the switch and the mirror is the ratio of the W/L for switch over W/L for the mirror. Current flowing through the switch 610 is mirrored in a mirror current branch 670 that includes a mirror transistor 652. The current sense circuit 600 obtains an accurate measure of current through the switch 610 by applying voltages at the source and/or drain terminals of the mirror transistor 652 that more closely approximate an average source and drain terminal voltages of the constituent transistors 611-616 of the switch. Thus, a relatively accurate measurement of the switch current may be obtained.

Although the set of transistors 611-616 are connected in parallel between terminals 603, 604 the transistors 611-616 are configured as a 2×3 array of transistors. The array allows a more efficient use of space on a semiconductor substrate. In one embodiment, the transistors 611-616 are approximately equally sized and the transistors 611-616 may be referred to as "unit transistors". However, the principles of the present invention may also apply to a switch in which the constituent transistors 611-616 are not similarly sized. The constituent transistors 611-616 may all be p-type field-effect transistors, or they may all be n-type field-effect transistors, without limiting the principles of the present invention. In FIG. 6 each transistor 611-616 is illustrated using symbols that are ambiguous as to the polarity type of the transistors. In either case, the source terminals of each are identified with "S", and the drain terminals of each are identified with "D". Although FIG. 6 illustrates an embodiment in which the switch whose current is to be measured is composed of six constituent transistors, the principles of the present invention can be applied to any number of multiple transistors. The total number of constituent transistors can be smaller, for example, as few as two, or can be larger, with there theoretically being no upper limit. In order not to obscure the principles of the present invention by using an overly complicated example, the principles of the present invention will first be introduced with respect to the current sense circuit 600 of FIG. 6 in which the switch has a certain number of constituent transistors. Furthermore, although the described embodiments of the present invention involve an array of constituent transistors forming the switch, there will be also be some metallization resistance regardless of the number of rows or columns in such an array. Accordingly, the principles of the present invention apply for any number of rows (one or more) in the array, and any number of columns (one or more) in the array, and even for configurations of constituent transistors that are not in an array at all. Referring to FIG. 6, each of the gate terminals of the constituent transistors 611-616 are "coupled together". Two circuit nodes are "coupled" or "coupled together" if they are either electrically connected with or without intermediate implicit or explicit passive components such as resistors, or if they have disposed therebetween some mechanism which permits the voltage at each of the nodes to track each other. In FIG. 6, the control electrodes, e.g. gate terminals, of the constituent transistors are coupled together in that they each receive approximately the same voltage VG. Main electrodes, e.g. drain terminals, of each of the constituent transistors 611-616 are also coupled together. To complete the parallel configuration, the other main electrodes, e.g. source terminals, of each of the constituent transistors 611-616 are coupled together.

The set of constituent transistors 611-616 are connected via a network of paths. In an integrated solution, where all switches 611-616 are realized on a single chip, the paths will comprise conductive tracks such as metallised tracks. The tracks have an implicit resistance associated with them, one of which is shown as 617. A resistor will be called "explicit" if it is designed to be part of the circuit whereas a resistor will be called "implicit" if it is not designed to be part of the circuit but is present due to some finite resistance of conductive materials. In FIG. 6, each of the resistors shown within switch 610 may be an implicit resistor. The resistors 621-624, 631-634 shown outside of the switch 610 may be explicit resistors, or a combination of explicit and implicit resistors. For example, the size of the explicit resistor could be chosen such that the total of the series explicit and implicit resistances is equal to the desired resistance for averaging. Although the set of transistors 611-616 is configured in parallel, the main electrode voltages, e.g. drain voltages, of the constituent transistors may be significantly different due to the implicit resistances shown in FIG. 6 within the switch 610. Likewise, the source voltages of the constituent transistors may differ due to the implicit resistances. Such implicit resistances might significantly reduce the accuracy in measuring the current through the switch. In accordance with this embodiment of the present invention, a more accurate measurement of the current through the switch is obtained by applying a function of the individual main electrode voltages, e.g. drain voltages, to a main electrode, e.g. drain terminal of the mirror transistor 652. Similarly, a function of the individual source voltages is applied to the source terminal of the mirror transistor 652. Preferably, all the main electrode voltages, e.g. both the drain and source voltages, are set in this way. The 'function' is preferably an average of the individual voltages. As an example, to obtain the averaged drain voltage of the consistent transistors 611-616, the current sense circuit 600 includes a drain voltage averaging mechanism coupled between the drain terminals of each of the constituent transistors 611-616 and an averaging drain voltage conveyance mechanism 661. It should be noted that the sense resistors 620, 630 are not connected in series with the main current flow path through the switch, but only connect to high-impedance inputs of op-amplifiers 641, 642.

Any mechanism for providing an "average" of the drain voltages of the constituent transistors will suffice. Median values or weighted averages are also included within the scope of the present invention but they are less preferred. The drain voltage averaging mechanism illustrated in the form of drain sense resistors 620 configured as shown in FIG. 6 is only one example. An alternative solution is to use switched capacitors. Furthermore, the averaging drain voltage conveyance mechanism 661 may be any mechanism that is capable of providing an averaged drain voltage on the drain terminal of the mirror transistor 652 based on the measure average drain voltage provided by the drain voltage averaging mechanism (e.g., drain sense resistors 620). The averaging drain voltage conveyance mechanism 661 should be able to provide such a voltage without providing or drawing current to or from the drain terminal of the mirror transistor 652 at least in quantities that are significant. It is preferred that the function of individual voltages is an average of the individual drain voltages. This need not be an exact mathematical average of the drain voltages, but may be any voltage that permits the drain-to-source voltage of the unit transistor 652 to be between the lowest drain-to-source voltage and the highest drain-to-source voltage of the constituent transistors of the switch. It is more preferred, however, if the averaging allows the drain-to-source voltage of the unit transistor 652 to be the minimum drain-to-source voltage of the constituent transistors of the switch plus 10% to 90%, or optionally 25% to 75%, or even 40% to 60% of the difference between the minimum drain-to-source voltage and the maximum drain-to-source voltage. In the illustrated embodiment of FIG. 6, however, an attempt to is made to configure the drain sense resistors 620 such that a relatively accurate mathematical average of the drain voltages is provided to the averaging drain voltage conveyance mechanism 661. Note that the drain sense resistors 621 and 622 are each directly coupled to a single drain terminal of a single constituent transistor. For example, resistor 621 is directly coupled to the drain terminal of only constituent transistor 611. Likewise, resistor 622 is only directly coupled to the drain terminal of only constituent transistor 612. In contrast, the drain sense resistors 623 and 624 are each directly coupled to a shared drain terminal of two consistent transistors. For instance, resistor 623 is directly coupled to the drain terminal of both constituent transistors 613 and 615, whereas resistor 624 is directly coupled to the drain terminal of both constituent transistors 614 and 616. Accordingly, in order to obtain a relatively accurate drain voltage average, the resistors 621 and 622 may be sized to be about twice the size of the resistors 623 and 624. In this description and in the claims, a "resistor" may be a single resistor or a network of resistors (explicit and/or implicit) that provide a collective resistance between two nodes of the collective resistor. Furthermore, a resistor is "directly coupled" to another circuit node if there are no explicit resistors between the resistor and the circuit node. In one embodiment, the averaging drain voltage conveyance mechanism 661 includes an operational amplifier 641 and a source follower transistor 651 configured as shown in FIG. 6. The operational amplifier 641 is coupled to the drain sense resistors 620 at its positive input terminal. The source follower transistor 651 receives the output of the operational amplifier 641 at its gate terminal. The drain terminal of the source follower transistor 651 is coupled to the output terminal 601 from which the sense current $I_{SENSE}$ may be detected. The source terminal of the source follower transistor 151 is coupled to the drain terminal of a mirror transistor 652, and to the negative input terminal of the operational amplifier 641. In this configuration, the averaged drain voltage of the constituent transistors 611-616 is provided to the drain terminal of the mirror transistor 652.

The current sense circuit 600 includes a source voltage averaging mechanism coupled between the source terminals of each of the constituent transistors 611-616 to obtain a function of the source voltage of the consistent transistors 611-616. The resulting function of the source voltage is conveyed to the source of the mirror transistor 652 by a conveyance mechanism 662. As above, it is preferred that the 'function' is an average of the individual source voltages of the constituent transistors. The averaging source voltage conveyance mechanism 662 should be able to provide such a voltage without providing or drawing current to or from the source terminal of the mirror transistor 652 at least in quantities that are significant. In FIG. 6 the averaging source voltage conveyance mechanism 662 is an amplifier 652 having its positive input terminal coupled to the source voltage averaging mechanism (e.g. source sense resistors 630), and having its output and negative input terminals coupled to the source terminal of the mirror transistor 652. The "average" of the source voltages need not be an exact mathematical average of the source voltages, but may be any voltage that permits the drain-to-source voltage of the unit transistor 652 to be between the lowest drain-to-source voltage and the highest drain-to-source voltage of the constituent transistors of the switch.

In the circuit of FIG. 6 the source sense resistors 630 are configured such that a relatively accurate mathematical average of the source voltages is provided to the averaging source voltage conveyance mechanism 662. Note once again that the source sense resistors 633 and 634 are each directly coupled to a single source terminal of a single constituent transistor. For example, resistor 633 is directly coupled to the source terminal of only constituent transistor 615. Likewise, resistor 634 is only directly coupled to the source terminal of the constituent transistor 616. In contrast, the source sense resistors 631 and 632 are each directly coupled to a shared source terminal of two consistent transistors. For example, resistor 631 is directly coupled to the source terminal of both constituent transistors 611 and 613, whereas resistor 632 is directly coupled to the source terminal of both constituent transistors 612 and 614. Accordingly, in order to obtain a relatively accurate source voltage average, the resistors 633 and 634 may be sized to be about twice the size of the resistors 631 and 632. The size of the resistors may be experimented with in order to obtain a highly accurate measurement of average source voltage. If the constituent transistors were not unit transistors, the size difference might be accommodated by adjusting the size of the resistors as well. In FIG. 6, each drain terminal and each source terminal of the constituent transistor is coupled to a corresponding resistor for a more accurate drain voltage and source voltage averaging. However, depending on the need for accurate sense current measurement, fewer than all (perhaps as few as two) of the drain terminals may be sampled to obtain the drain voltage average and/or fewer than all (perhaps as few as two) of the source terminals may be sampled to obtain the source voltage average. The embodiment of FIG. 6 could be modified to a 2×2 array of constituent transistors by removing constituent transistors 615 and 616, removing source sense resistors 633 and 634, and doubling the size of resistors 623 and 624. The embodiment of FIG. 6 could be modified to a 1×2 array of constituent transistor by removing constituent transistors 613 through 616, sense resistors 623, 624, 633 and 634. It would not be necessary to resize the resistors 631 and 632 since the ratio of the size of the source sense resistors to the size of the drain sense resistors is not an important factor in the accuracy of the current sensing operation.

By forcing $V_{DS}$ to be equal for the devices used in the switch and the mirror, the ratio of the currents in the switch and the mirror is determined by geometry of those devices only, which gives improved precision.

Figure 7:
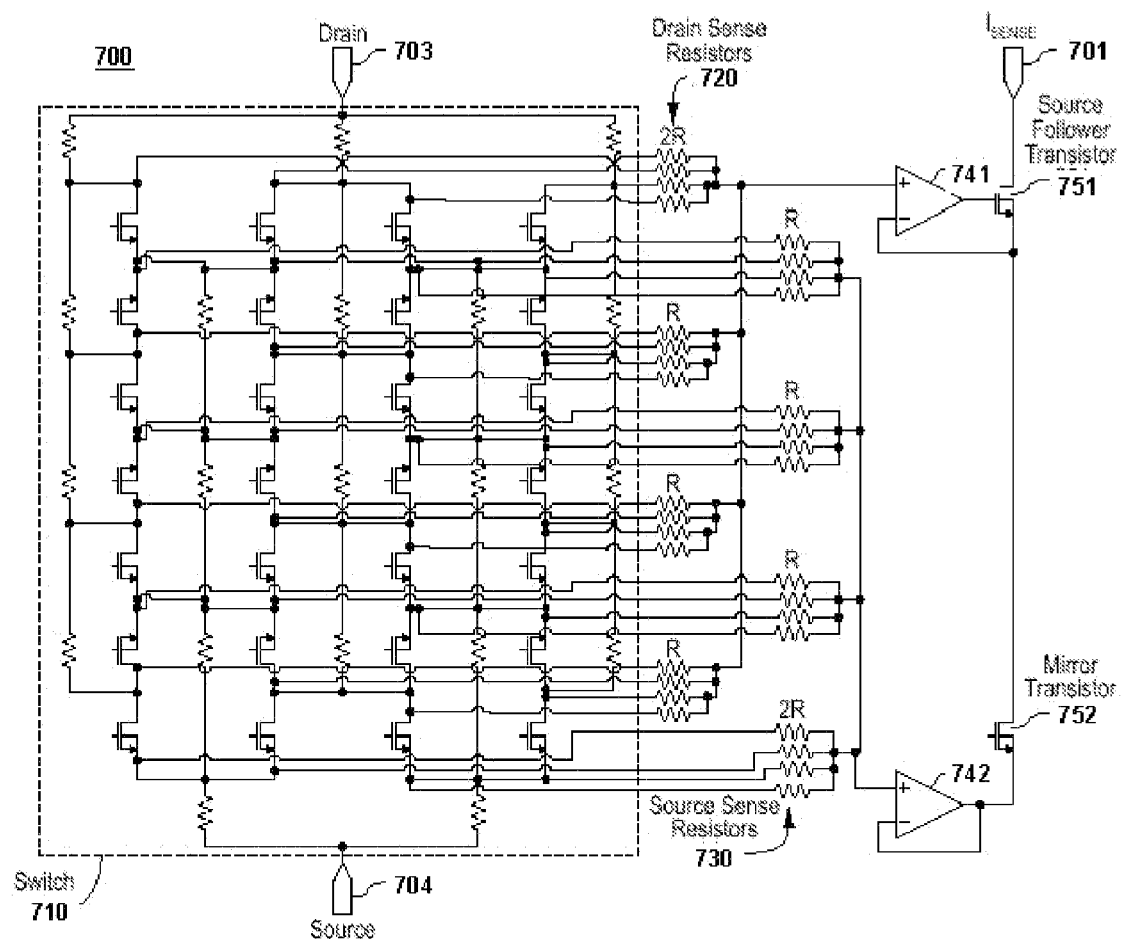
FIG. 7 shows another current monitoring apparatus comprising multiple power transistors.

FIG. 7 illustrates a more complex embodiment in which a switch 710 comprises an array of twenty-eight constituent transistors formed as an array having four columns and seven rows. Each constituent transistor of the switch 710 is connected in parallel between a collective drain terminal 703 and a collective source terminal 704. As in FIG. 6, a network of drain sense resistors 720 and source sense resistors 730 are connected to individual ones of the transistors in the array 710. In FIG. 7 the network of sense resistors connects to every transistor but it is also possible to sample only a sub-set of the drain terminals and/or source terminals. Furthermore, each transistor is illustrated as being an n-type field effect transistor although, as explained above, they could just as well be p-type transistors in which case the direction of current flow between source and drain would be reversed.

Figure 8:
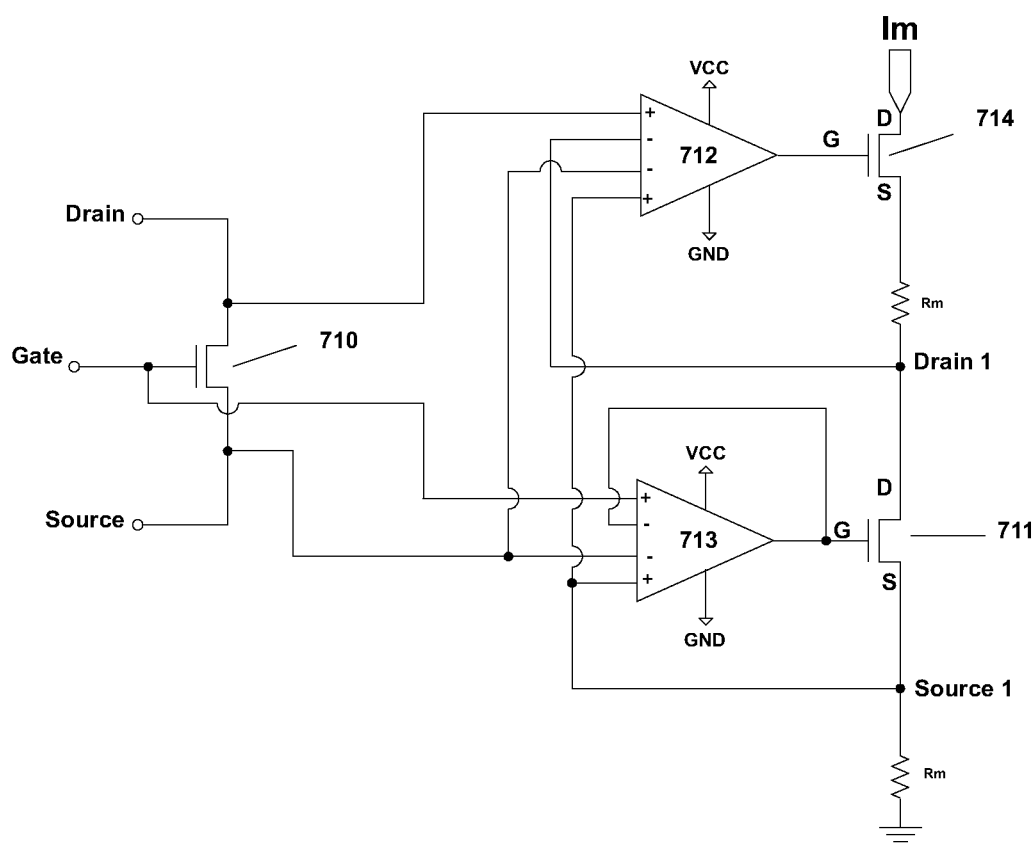
FIG. 8 shows an embodiment of the current monitoring apparatus using four input operational amplifiers.
Figure 10:
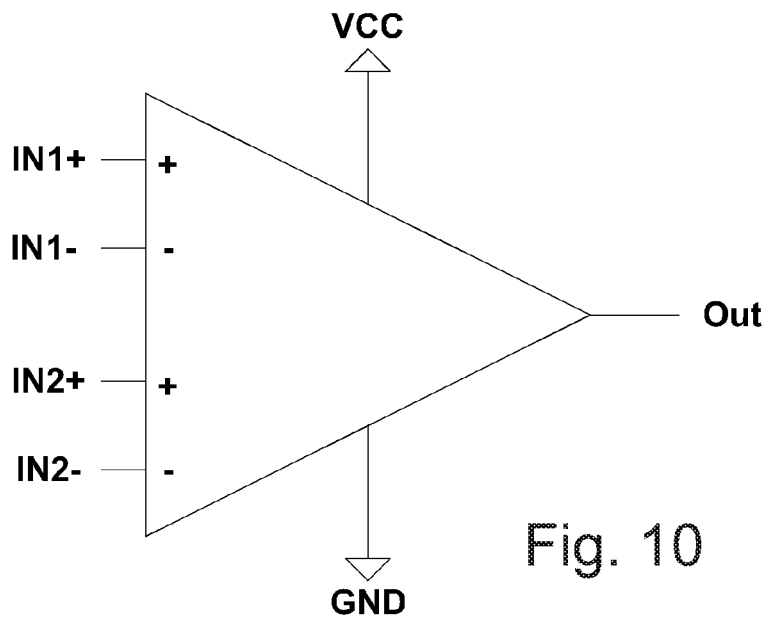
FIG. 10 schematically shows a four input amplifier used in FIGS. 8 and 9.
Figure 11:
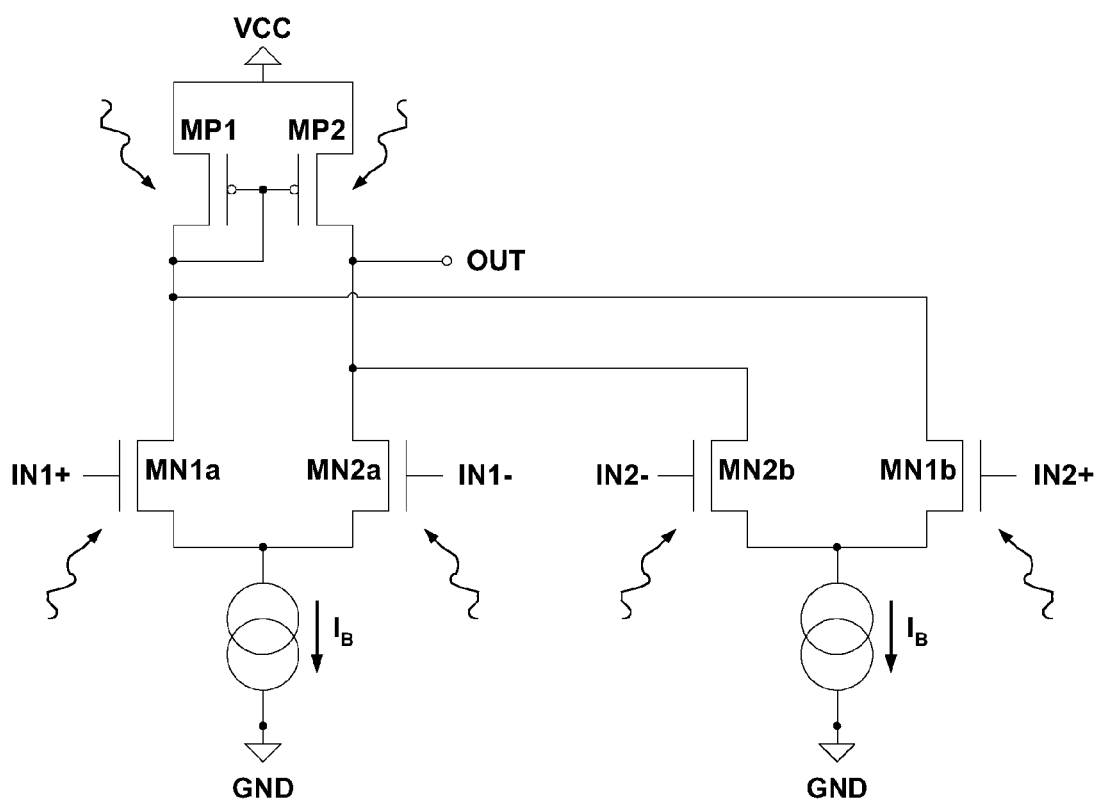
FIG. 11 shows the amplifier of FIG. 10 in more detail.

FIG. 8 illustrates another embodiment relying on an operational amplifier with four inputs instead of two. An example of such an operational amplifier is shown schematically in FIG. 10 and shown in more detail in FIG. 11. For the sake of clarity and to better isolate the improvements brought by this embodiment, most of the explicit and implicit resistors have been omitted and the power switch 710 is shown as a single transistor. Also for the sake of clarity, we will assume that the switch transistor 710 and the mirror transistor 711 are operating in their linear region (i.e. VDS<VGS-$V_{Th}$) although this does not limit the use of the circuit of FIG. 8 to cases where VDS<VGS-$V_{Th}$.

The current flowing in the transistor switch 710 is approximated by equation 1 (Eq. 1):

$$I_{SWITCH} = KW1/L1(VGS1-V_{Th})VDS1 \qquad \text{Eq. 1}$$

where:
W1 is the width of the switch transistor 710;
L1 is the length of the switch transistor 710;
VGS1 is the voltage difference between the voltage VG1 and the voltage VS1 applied respectively at the gate electrode and the source electrode of the transistor 710;
VDS1 is the voltage difference between the voltage VD1 and the voltage VS1 applied respectively at the drain electrode and the source electrode of the transistor 710;
K is a technological constant well-known to those skilled in the art; and
$V_{Th}$ is the threshold voltage of the transistor 710.

The current flowing in the mirror transistor 711 is approximated by equation 2 (Eq. 2) here below:

$$I_{SENSE} = KW2/L2(VGS2-V_{Th})VDS2 \qquad \text{(Eq. 2)}$$

where:
W2 is the width of the mirror transistor 711;
L2 is the length of the mirror transistor 711;
VGS2 is the voltage difference between the voltage VG2 and the voltage VS2 applied respectively at the gate electrode and the source electrode of the transistor 711;
VDS2 is the voltage difference between the voltage VD2 and the voltage VS2 applied respectively at the drain electrode and the source electrode of the transistor 710;
K is a technological constant well known to those skilled in the art; and
$V_{Th}$ is the threshold voltage of the transistor 710.

In this example, we can assume that the technological constant K and the threshold voltage $V_{Th}$ are the same for both the switch transistor 710 and the mirror transistor 711. This is the case if for instance the two transistors are integrated in the same way in the same semiconductor substrate. If the transistors were not integrated in the same semiconductor substrate (for example, where the switch transistor is a discrete transistor) the transistor switch could be chosen among a set of different transistors that either vary because of fabrication tolerances or because they were built in different technologies. This of course is of importance to stress the fact that the invention is not limited to a fully integrated current sense circuit. The feedback loops built around amplifiers 712 and 713 guarantee that the ratio $I_{SWITCH}/I_{SENSE}$ will remain constant by imposing that VD1–VS1=VD2–VS2 and VG1–VS1=VG2–VS2.

In FIG. 6, an amplifier 642 sinks the source current of the mirror transistor 652. It has been observed that in practical applications the voltage at the source of the mirror transistor and the switch transistor could be different (by several tens of millivolts) in spite of the feedback loop introduced by amplifier 642.

With $V_G$ being the same for the switch and the mirror, the ratio of current depends on voltages:

$$I_{switch}/I_{mirror} = (W1/L1)/(W2/L2)*(V_G-Vs \text{ switch}-V_{TH})/\\(V_G-Vs \text{ mirror}-V_{TH})*(V_D-Vs \text{ switch})/\\(V_D-Vs \text{ mirror})$$

In FIG. 8, amplifier 713 forces (VG–Vs) at the switch to be equal to ($V_G$–Vs) at the mirror. Vs mirror can be different from Vs switch, and similarly VG mirror can be different from $V_G$ switch. If $V_{TH}$ is the same for both transistors, which is the case where the devices are implemented on the same substrate or same process, $V_{GS}$–$V_{TH}$ is the same for both transistors. While on FIG. 6 the same $V_G$ is applied to the gate of both switch and mirror and a circuit tries to impose the same voltage on the source of the mirror as is measured on the source of the switch, in FIG. 8, $V_G$ switch can be different from $V_G$ mirror (similarly for the source voltages) but the circuit imposes $V_G$ switch–$V_S$ switch=$V_G$ mirror–$V_S$ mirror.

The drain of transistor 710 is connected to a first non-inverting input of amplifier 712 while the drain of transistor 711 is connected to a first inverting input of amplifier 712. The source of transistor 710 is connected to a second inverting input of amplifier 712 while the source of transistor 711 is connected to a second non-inverting input of amplifier 712. The output of amplifier 712 is connected to the gate of a cascode transistor 714. The source of the cascode transistor 714 is connected to the drain of the mirror transistor 711. The gate of transistor 710 is connected to a first non-inverting input of amplifier 713 while the gate of transistor 711 is applied to a first inverting input of amplifier 713. The source of transistor 710 is connected to a second inverting input of amplifier 713 while the source of transistor 711 is connected to a second non-inverting input of amplifier 713. Amplifier 712 will bias the gate of the cascode transistor 714 so that (VD1−VS1)=(VD2−VS2) and amplifier 713 will bias the gate of the mirror transistor 711 so that (VG1−VS1)=(VG2−VS2) thereby guaranteeing that the ratio of $I_{SWITCH}/I_{SENSE}$ is constant, hence increasing the precision of the current mirror.

Figure 9:
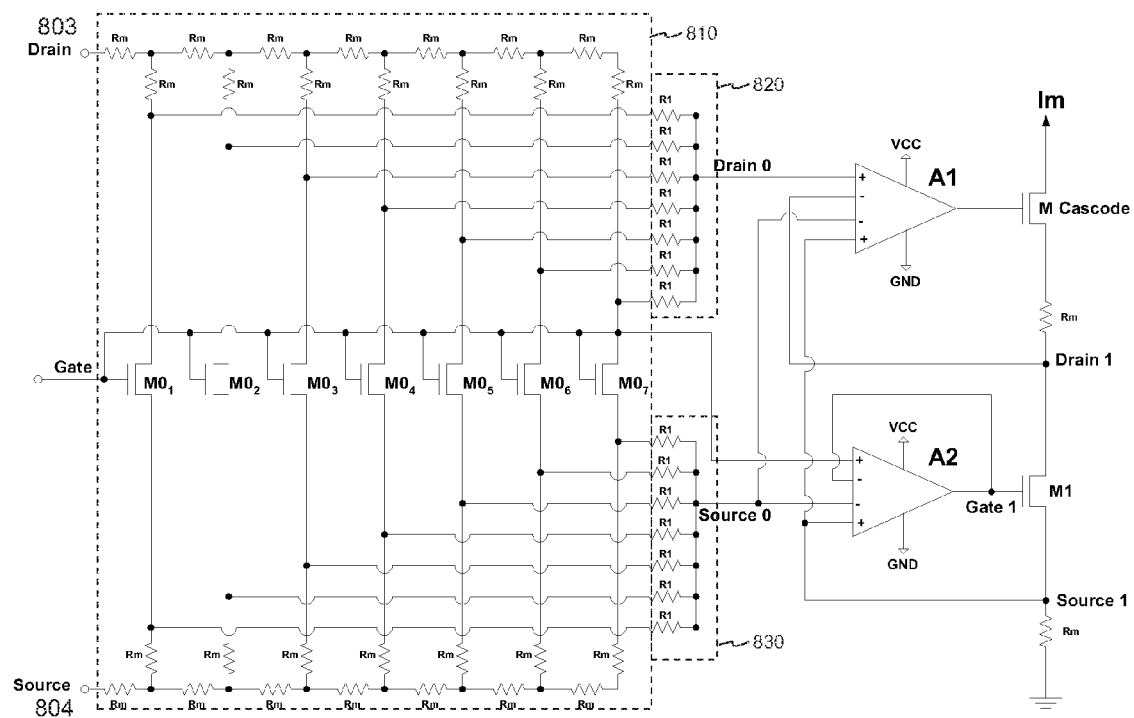
FIG. 9 shows another embodiment of the current monitoring apparatus using four input operational amplifiers and multiple transistors.

FIG. 9 shows a circuit which combines the features of the circuits shown in FIG. 6 and FIG. 8. Switch 810 comprises seven field-effect transistors MO1-MO7 configured in parallel between a collective drain terminal 803 and a collective source terminal 804. A set of seven drain sense resistors 820 connect to the first non-inverting input of amplifier A1 and a set of seven source sense resistors 830 connect to the second inverting input of amplifier A2. Amplifiers A1, A2 are connected together, and to other components, in the same manner as shown in FIG. 8.

Although the present invention has been described with reference to use of a current mirror, the present invention has a wider scope and includes any sensor capable of sensing current flowing along the path through the power switch, which does not involve placing a sense resistor in series with the power switch. A Hall sensor or galvanomagnetic sensor could be used. Current flow generates magnetic field around the conductor. By measuring the magnetic field one has thus an indirect measurement of the current in the conductor without introducing a voltage drop in the path of the current. The hall sensor/magnetic sensor could be external or could be integrated on the same substrate as the switch.

Calibration

The current measurement has a temperature dependence due to a combination of the technology parameters of the current mirror, the impedance of the branches and impedances between the current mirror and the analog to digital converter 470, regardless of whether the ADC works in the voltage or current domains. The conversion gain of the analog to digital converter is temperature dependent. To achieve the desired accuracy of the current measurement, a calibration as a function of temperature is necessary. A linear relationship is assumed between the current as measured $I_{measured}$ and the actual current in the switch $I_{real}$:

$$I_{real} = K_1 \cdot I_{measured} + K_2$$

$K_1$ and $K_2$ are functions of the temperature. The temperature dependence of $K_1$ and $K_2$ can be approximated with a function, for example with a linear function aT+b, where T is the temperature and a and b parameters that are not a function of temperature. The temperature can be measured by any temperature sensor. In particular, the voltage drop across a diode (or set of diodes) through which a reference current is forced can be advantageously be used as a means to measure the temperature. Such a sensor is small enough to be placed in the middle of a component whose temperature must be known with sufficient precision to correctly compensate for temperature drift. In some cases, it will even be possible to use a parasitic diode (or a set of parasitic diodes) as a temperature sensor.

Integrated circuits are tested after fabrication. Testing is usually performed at several temperatures in the range of temperatures across which the circuit is expected to operate. Testing typically involves imposing signals (e.g. current or voltage) at certain nodes (typically inputs) of the circuit and measuring signals at other nodes of the circuits (typically outputs). Data gathered during testing may be used to calibrate the circuit. For example, in the case of the current sense circuit described above, known currents can be forced through the switch transistor at different temperatures (e.g. 25 degrees Celsius and 125 degrees Celsius). Consider:

$I_{R1}$ to be a first reference current forced into the switch transistor and $I_{R2}$ to be a second reference current forced into the switch transistor.

$T_H$ and $T_L$ to be two temperatures at which the currents $I_{R1}$ and $I_{R2}$ are forced through the transistor switch (where $T_H > T_L$).

$I_{M1TH}$ to be the value of the current measured by the data processing chain including the sensor, gain stage and ADC, when the current $I_{R1}$ is forced through the transistor switch at the temperature $T_H$.

$I_{M1TL}$ to be the value of the current measured by the data processing chain including the sensor, gain stage and analog to digital converter when the current $I_{R1}$ is forced through the transistor switch at the temperature $T_L$.

$I_{M2TH}$ to be the value of the current measured by the data processing chain including the sensor, gain stage and analog to digital converter when the current $I_{R2}$ is forced through the transistor switch at the temperature $T_H$.

$I_{M2TL}$ to be the value of the current measured by the data processing chain including the sensor, gain stage and analog to digital converter when the current $I_{R2}$ is forced through the transistor switch at the temperature $T_L$.

Having assumed a linear dependency between $I_{real}$ and $I_{measured}$, we can write:

$$I_{R1} = G_{TH} I_{M1TH} + O_{TH}$$

$$I_{R1} = G_{TL} I_{M1TL} + O_{TL}$$

Where $G_{TH}$ is the value of $K_1$ when the temperature is $T_H$, $G_{TL}$ is the value of $K_1$ when the temperature is $T_L$, $O_{TH}$ is the value of $K_2$ when the temperature is $T_H$, $O_{TL}$ is the value of $K_2$ when the temperature is $T_L$.

$$I_{R2} = G_{TL} I_{M2TL} + O_{TL}$$

$$I_{R2} = G_{TH} I_{M2TH} + O_{TH}$$

From which we can extract:

$$G_{TH} = (I_{R1} - I_{R2})/(I_{M1TH} - I_{M2TH})$$

$$G_{TL} = (I_{R1} - I_{R2})/(I_{M1TL} - I_{M2TL})$$

$$O_{TH} = I_{R1} - G_{TH} I_{M1TH}$$

$$O_{TL} = I_{R1} - G_{TL} I_{M1TL}$$

Based on these expression we now build:

$$G_G = (G_{TH} - G_{TL})/(T_H - T_L)$$

$$G_O = (O_{TH} - O_{TL})/(T_H - T_L)$$

During production testing, a calibrated current is imposed by a test probe into the switch. This current is measured at 2 different temperature levels, such as 25 degrees Celsius and 125 degrees Celsius. An Analog to Digital converter (ADC) generates digital values such as an 8 bit code for the port current and at the 2 different temperatures. These codes are stored in a non-volatile memory, such as an OTP (one time programmable) memory array.

During operation, the following equation is calculated:

$$Ireal = K1 \cdot Imeasured + K2$$

where:

$$K1 = GTL + GG*(Tmeasured - TL)$$

$$K2 = OTL + GO*(Tmeasured - TL) \quad I_{real} \text{ is the actual current.}$$

Tmeasured is the local temperature of the transistor switch measured with the ADC. Similar formulas can be drawn with GTH, OTH and TH taken as a reference.

FIG. 12 shows the relationship between $I_{real}$ and $I_{measured}$ at two values of test current ($I_{R1}$, $I_{R2}$) and at two different operating temperatures ($T_{low}$, $T_{high}$). FIG. 13 shows the variation of the ADC gain with temperature and FIG. 14 shows variation of the ADC offset with temperature.

During operation, the current is measured and the measurement result is compensated for the actual temperature by performing a linear interpolation according to $I_{real} = K_1 \cdot I_{measured} + K_2$ with the values stored in the OTP for GG, GTL, OTH, OTL, GO and TL. This method of calibration is organized in a very efficient way by measuring 2 reference currents at two different temperatures during the production test of the device. This allows calculation of the actual current during normal operation of the current mirror in the application with a temperature correction with a single formula.

Temperature Sensing

The on-resistance of the power switch of a PSE connecting a Powered Device (PD) to the power supply in PoE applications will typically vary from 0.6 ohm at 20 degrees Celsius to as much as 1.2 ohm at 125 degrees Celsius. The power dissipation in the switch of the PSE (Joule heating) can be higher than half a watt, due to currents in the transistor switch that will be as high as 612 mA in current PoE applications. The power dissipation in the transistor switch creates a hot spot on the semiconductor substrate in which the transistor switch is integrated. PSE devices often comprise more than one transistor switch (see switches 421, 422 in FIG. 4). Let us take as an example that the PSE device comprises 4 transistor switches that control the power delivered to 4 users. A PSE device will typically connect the PD devices to a 48V DC power supply.

Figure 15:
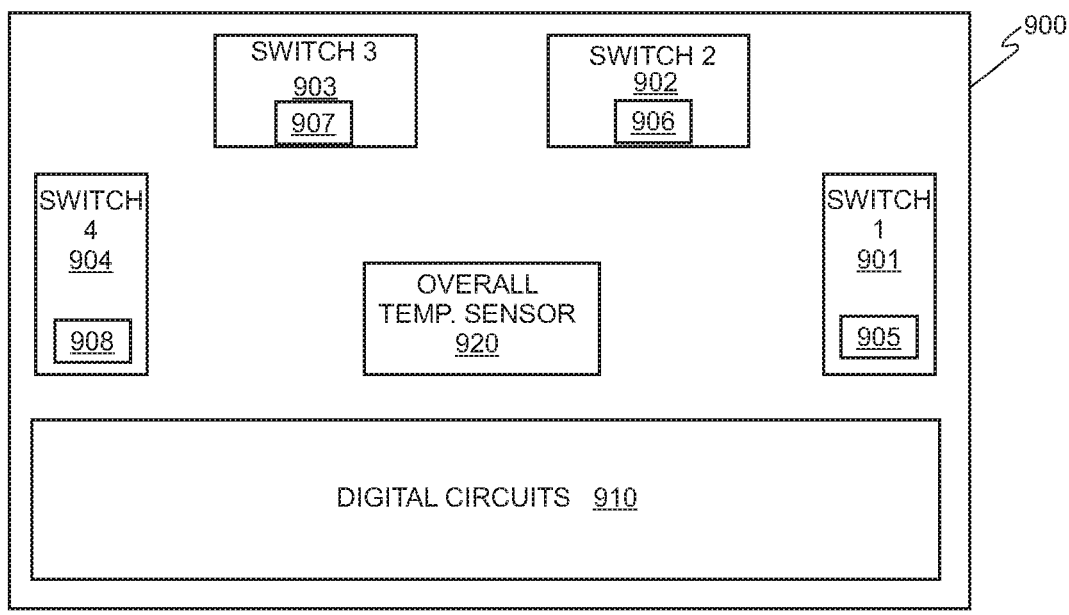
FIG. 15 shows a physical arrangement of power switches and temperature sensors on a substrate.
Figure 16:
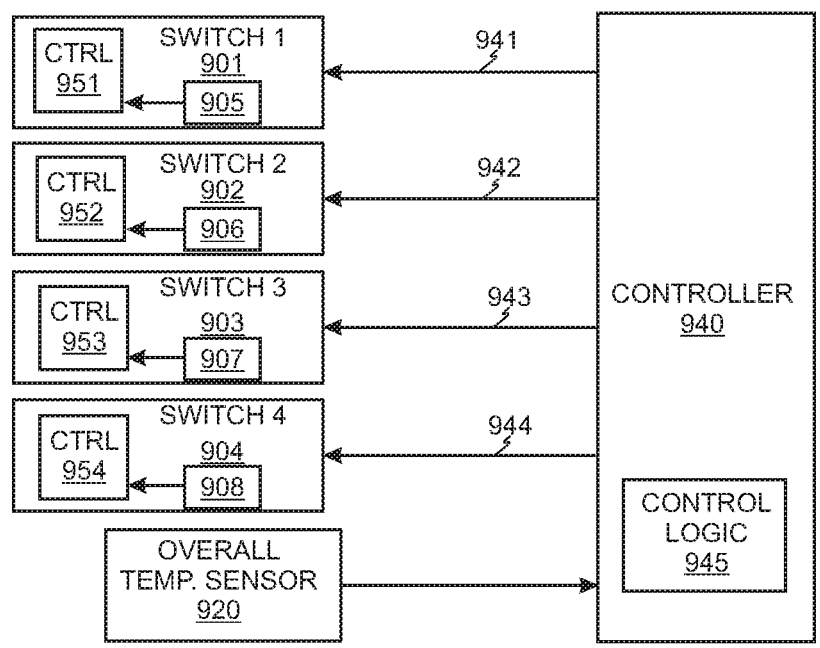
FIG. 16 schematically shows apparatus for controlling switches of FIG. 15.

Because of its good thermal conductivity, the silicon substrate that is commonly used to integrate semiconductor devices is considered as a thermal shortcut, i.e. the temperature is usually considered as (almost) constant across the semiconductor substrate. While this approximation holds for circuits that will not dissipate power excessively, in Power Applications like PoE, it has been found that the high level of power dissipated in the devices integrated in the substrate can cause significant temperature differences across the semiconductor substrate. It has been found that it is not sufficient to rely on one temperature reading taken at a single location on the semiconductor substrate. FIGS. 15 and 16 show a solution to this problem. FIG. 15 shows the physical layout of four switches 901-904 mounted upon (integrated in) a suitable semiconductor substrate 900. This aspect of the invention is applicable to a semiconductor substrate, where the switches are integrated with the other logic and to a situation where the switches are each a discrete device mounted on the same circuit board. A total of five temperature sensors 905-908, 920 are provided. A temperature sensor is mounted locally to each of the switches, e.g. switch 901 has sensor 905, switch 902 has sensor 906 etc. Digital circuits 910 are shown occupying a further portion of the substrate 900. A further temperature sensor 920 is positioned on the substrate 900 in a generally central position such that it can respond to the overall temperature of the substrate. The temperature can be measured by any temperature sensor. In particular, the voltage drop across a diode (or set of diodes) through which a reference current is forced can be advantageously be used as a means to measure the temperature. Such a sensor is small enough to be placed in the middle of a component whose temperature must be known with sufficient precision to correctly compensate for temperature drift. In some cases, it will even be possible to use a parasitic diode (or a set of parasitic diodes) as a temperature sensor.

Each switch 901-904 has a controller 951-954 (or other regulation circuitry) which locally controls the switch. Each controller is responsive to the temperature sensor on that switch. For example, at switch 1, controller 951 receives a signal indicative of local temperature from temperature sensor 905. Each local controller 951-954 can locally control operation of the switch in response to the locally sensed temperature. In this manner, if one of the switches is running hot, e.g. because it is delivering more current than other switches, that switch can be locally controlled to reduce the operating temperature independently of operation of the other switches. Controller 940 is responsive to a signal from the further temperature sensor 920. Operation of controller 940 is governed by control logic 945. In the case where the entire chip is over-heating, the signal received from sensor 920 will exceed a temperature threshold value and controller 940 will reduce current in all of the switches 901-904 via control lines 941-944.

As an example of operation, when each temperature sensor 905-908 exceeds a first temperature threshold, regulation circuitry 951-954 reduces the current granted to the PD connected to that switch below a first current threshold. When the temperature exceeds a second temperature threshold (higher than the first threshold), the regulation circuitry 951-954 reacts by reducing the current granted to the PD connected to that switch below a second current threshold (lower than the first threshold). For example, the first temperature threshold can be 120 degrees Celsius and the first current threshold can be 60 mA; the second temperature threshold can be 140 degrees Celsius and the second current threshold can be 10 mA. Reducing the current gradually instead of in a mere on/off manner can allow the PD connected to the switch transistor to keep operating, even if with reduced performance. This is particularly important for Powered Devices such as remote surveillance cameras for which degraded performances are preferred to a complete shut down. The current reduction proposed here can be used to reduce power dissipation during transients and over-current conditions. Transient current increases are typical at start-up, i.e. when the transistor switch is turned ON to power a connected PD. The total parasitic capacitance of the cable, the connector and the powered user device can amount to more than 500° F. When turning on the switch (which means increase the VGS of an n-type MOS transistor switch), the drain voltage of the switch will decrease. The parasitic capacitance being connected between the drain of the transistor switch and the VDC supply node, a current will flow through the capacitor and into the transistor switch. The magnitude of that current is given by the well known formula $I = C \, dV/dt$ where I is the current flowing through the capacitor of capacitance C and $dV/dt$ is the derivative with respect to time of the voltage difference across the capacitor. When the switch is turned on, the voltage difference between the drain and the source of the transistor switch is still close to the full VDC (typically 48V). The power dissipated in the transistor switch being equal to the product VDS·I, the contribution to power dissipation of the current flowing through the parasitic capacitor and into the switch can be sufficient to increase the temperature of the transistor switch to levels that could damage it. To decrease the power dissipation, the gate voltage of the transistor switch will be decreased so as to decrease the current that is allowed to flow through it.

As explained earlier, relying on a set of local temperature sensors 905-908, rather than a single temperature sensor allows continued operation of the remaining 'cold' switches and reduces the current and power only in the 'hot' switch. Only one PD is affected while the three other will keep operating at their nominal supply current.

Figure 17:
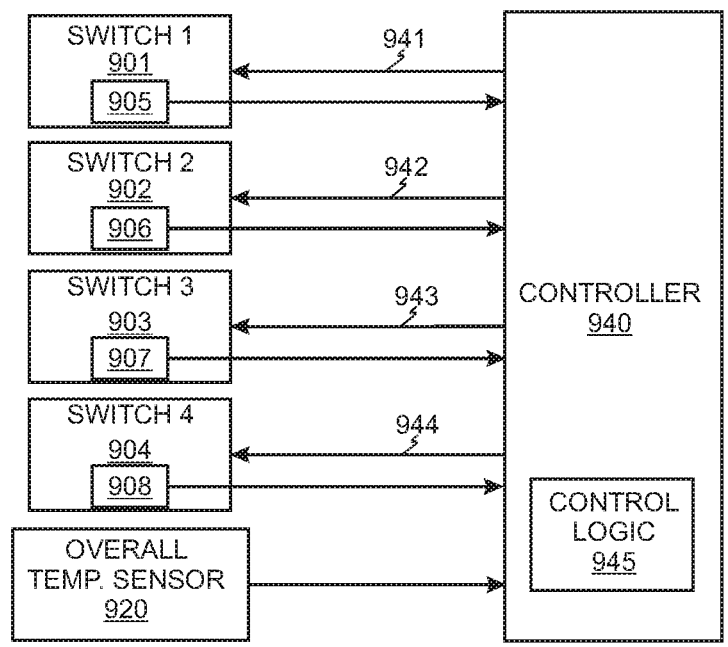
FIG. 17 schematically shows an alternative apparatus for controlling switches of FIG. 15.

FIG. 17 shows a variant of FIG. 16 where a controller 940 performs regulation of current for each switch 901-904. This avoids the need for a separate controller 951-954 in each switch. Although one controller 940 is used, the operation of the apparatus is the same as previously described, and each switch can be individually controlled based on local temperature.

Figure 18:
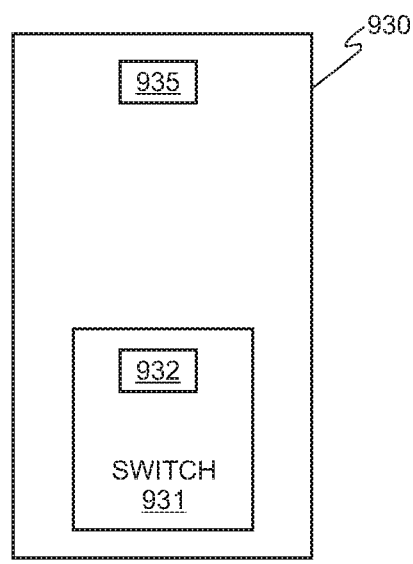
FIG. 18 shows a physical arrangement of a power switch and temperature sensors on a substrate of a Powered Device in a Power over Ethernet (PoE) system.

The scheme described above can be applied to a Powered Device (PD). FIG. 18 shows the physical layout of a substrate 930 within a Powered Device. The temperature in the middle of a DMOS switch 931 is measured by a temperature sensor 932 positioned locally to the switch 931. A second temperature sensor 935 is mounted on the substrate 930 at a position spaced from the switch, where it can respond to dissipation sources other then the power switch, such as the internal regulator). Similarly to as described above, switch 931 is controlled depending on the locally sensed 932 temperature, with the current flow through 931 being regulated according to temperature. Only in case where the total chip is overheating, the sensor 935 which is positioned away from the switch 931 will monitor the general over temperature and control switch 931 to reduce current flow, or to turn the switch off.

The current limitation level is adapted according to the temperature in order to keep the dissipation in the switch and the chip temperature under control during transients and overcurrent conditions. First, during start up a big external capacity is charged via the PoE-PD power switch. This results in a peak dissipation that is limited by an inrush current limitation. If, in parallel to this, the temperature in the middle of the switch is monitored a second limitation is installed. When an over temperature is flagged the inrush current level will be reduced until the flag is gone. Secondly, during normal operation the current limit is higher then during startup since the drop over the power switch is less then during startup resulting in a lower internal dissipation. If by any means the temperature increases without reaching the current limitation, the current limitation can be lowered in order to reduce the internal dissipation.

Power Management

In some PoE applications, several PSE devices are assembled to provide power to several PDs. For example, four PSE devices each comprising four power switches are assembled to provide power to up to sixteen PDs. Integrated PSE are mass produced, it is possible that some functions of the 4 assembled PSE become redundant. For instance, a PSE device will typically comprise a DC-DC converter to generate a voltage compatible with the digital electronics it comprises. Often, such a DC-DC converter would be able to supply the digital electronics of several PSE devices. In order to further limit power dissipation and the associated temperature increases, the four PSE devices considered here above will operate in a "master-slave" mode, i.e. a single PSE device will activate its DC-DC converter and supply the 3 other PSE devices. If the temperature of the master increases excessively, it might be advantageous to (a) request that another PSE device (among the three slave) enables its DC-DC converter (b) shut down its own DC-DC converter to decrease power dissipation in the expectation of reducing the temperature. The PSE that will take over the function of master will either be chosen randomly, or the closest to the master or the coldest PSE (hence the PSE that is most likely not to suffer from extra power dissipation). This aspect of the invention has an advantage of reducing power dissipation of any building block present in PSE or PD integrated circuits, in particular DC-DC converters, when these blocks become redundant.

Further Embodiment

Figure 19:
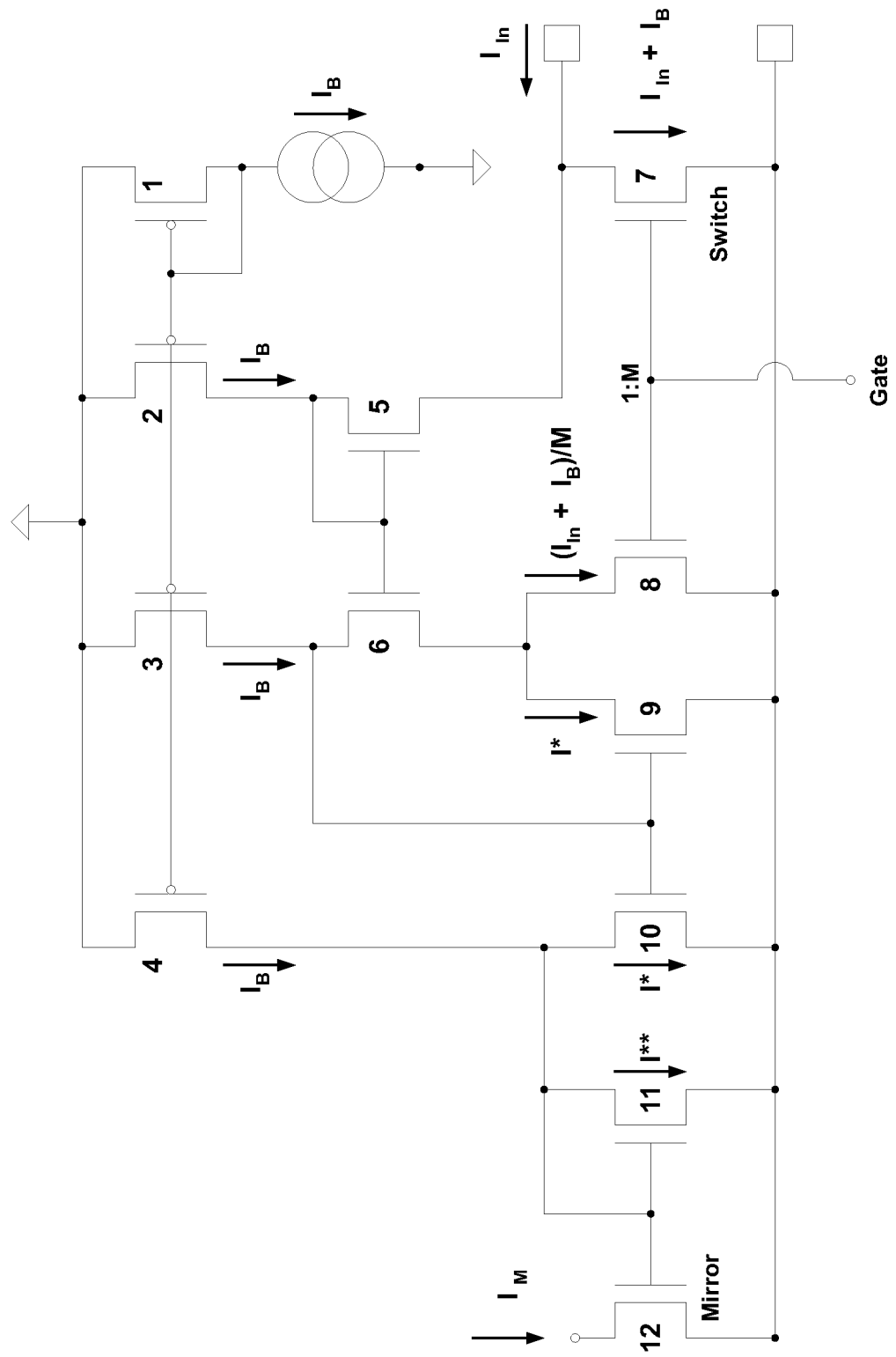
FIG. 19 shows another embodiment of a switch and current monitoring apparatus according to the present invention.

FIG. 19 shows another embodiment of a switch and current monitoring apparatus. In some applications, the precision of the measurement need not be as high as that obtained with the circuit structures shown above in other embodiments. In such cases, it may be practical to use a measurement structure with fewer components and that dissipates even less power than the structures discussed previously. This is an advantage particularly if the switch and the mirror structure are integrated in the same semiconductor substrate. Such a simplified structure can for example be used for the PD interface.

As shown in FIG. 19, a cascode current mirror comprising the transistors (5) and (6) is used to copy the drain voltage of the switch transistor (7) and force that voltage on the drain of the sense transistor (8). To guarantee that the bias current flowing in transistors (5) and (6) will be equal (a condition for the cascode structure to operate as desired), transistor (9) is placed in parallel with transistor (8) to sink the current difference $I^* = I_B = (I_{IN} + I_B)/M$.

A current source labeled $I_B$ is coupled to gates of transistors (1, 2 and 3) to provide a current $I_B$ to transistors (5) and (6). Transistors (1), (2), (3), (9), (5) and (6) can be seen as an example of how to implement the voltage conveying/setting part 450 shown in FIG. 5 described above.

The source, gate and drain voltages for transistors (7) and (8) being equal, the ratio of their current is constant and equal to the ratio $M = (W_7/L_7)/(W_8/L_8)$ where W and L are dimensions of the transistors (7) and (8) respectively. To get rid of the contribution of $I_B$ to the current I*, a further subtraction of $I_B$ is realized with the help of transistors (4), (10) and (11). Transistor (4) has its gate coupled to the current source $I_B$ to supply current $I_B$ to parallel coupled transistors (11 and 12).

I* is mirrored in transistor (10). The current I in transistor (11**) is then $I_B - I^* = (I_{IN} + I_B)/M$. I is then mirrored by transistor (12) and the current flowing in transistor 12** is used to measure the current in the switch transistor:

$I^{} = I_{IN}/M + I_{Bd}/M$. As long as $I_{IN} \gg I_B$, I will be an accurate image of $I_{INd}$: $I^{**} \cong I_{IN}/M$.

Transistor (7) can be regarded as an example or representation of the power switch 421 of FIG. 5. Transistors (4, 8, 9, 10, 11 and 12) can be regarded as an example of how to implement the current mirror 460 shown in FIG. 5, but with subtraction to compensate the monitoring current flow for errors introduced by a current contributed by the cascade current mirror circuit. Features of this embodiment can be combined with features of other embodiments set out above.

Figure 20:
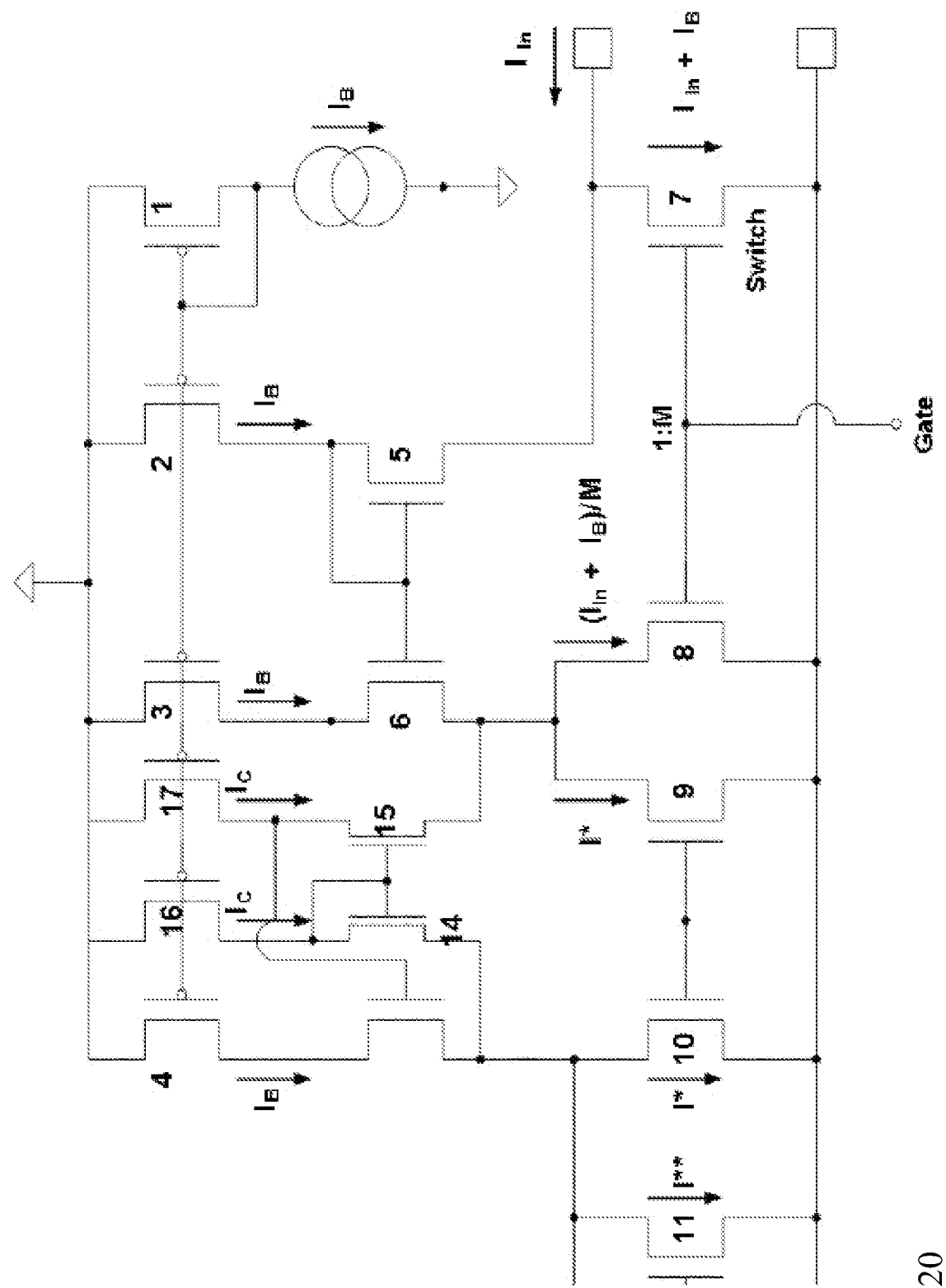
FIG. 20 shows yet another embodiment of a switch and current monitoring apparatus according to the present invention.

FIG. 20 shows another embodiment of a switch and current monitoring apparatus. In some applications, the precision of the measurement need not be a little higher as that obtained with the circuit structures shown above in other embodiments yet do not allow the use of operational amplifiers, . . . . In such cases, it may be practical to use a measurement structure with fewer components and that dissipates even less power than the structures discussed previously. This is an advantage particularly if the switch and the mirror structure are integrated in the same semiconductor substrate. Such a simplified structure can for example be used for the PD interface.

As shown in FIG. 20, a cascode current mirror comprising the transistors (5) and (6) is used to copy the drain voltage of the switch transistor (7) and force that voltage on the drain of the sense transistor (8). A current source labeled $I_B$ is coupled to gates of transistors (1, 2 and 3) to provide a current $I_B$ to transistors (5) and (6). To guarantee that the bias current flowing in transistors (5) and (6) will be equal (a condition for the cascode structure to operate as desired), transistor (9) is placed in parallel with transistor (8) to sink the current difference $I^*=I_B+I_C+(I_{IN}+I_B)/M$ (see FIG. 20 for the definition of IC).

Transistors (1), (2), (3), (9), (5) and (6) can be seen as an example of how to implement the voltage conveying/setting part 450 shown in FIG. 5 described above.

The source, gate and drain voltages for transistors (7) and (8) being equal, the ratio of their current is constant and equal to the ratio $M=(W_7/L_7)/(W_8/L_8)$ where W and L are dimensions of the transistors (7) and (8) respectively. To get rid of the contribution of $I_B$ to the current $I^*$, a further subtraction of $I_B$ is realized with the help of transistors (4), (10) and (11). Transistor (4) has its gate coupled to the current source $I_B$ to supply current $I_B$ to parallel coupled transistors (11 and 12). The transistors 13 together with transistors 14, 15, 16 and 17 act to keep the drain to source voltage VDS of transistor 10 equal to the drain to source voltage VDS of transistor 9. Observe that the current contribution IC (flowing through transistors 15 and 17) to I* is subtracted further on by transistors 14 and 16.

I* is mirrored in transistor (10). The current I** in transistor (11) is then $I_B-(I^*-IC)=(I_{IN}+I_B)/M$. I** is then mirrored by transistor (12) and the current flowing in transistor 12 is used to measure the current in the switch transistor:

$I^{}=I_{IN}/M+I_B/M$. As long as $I_{IN} \gg I_B$, I will be an accurate image of $I_{IN}$: $I^{**} \cong I_{IN}/M$.

Transistor (7) can be regarded as an example or representation of the power switch 421 of FIG. 5. Transistors (4, 8, 9, 10, 11, 12, 13, 14, 15, 16 and 17) can be regarded as an example of how to implement the current mirror 460 shown in FIG. 5, but with subtraction to compensate the monitoring current flow for errors introduced by a current contributed by the cascade current mirror circuit. Features of this embodiment can be combined with features of other embodiments set out above.

Figure 21:
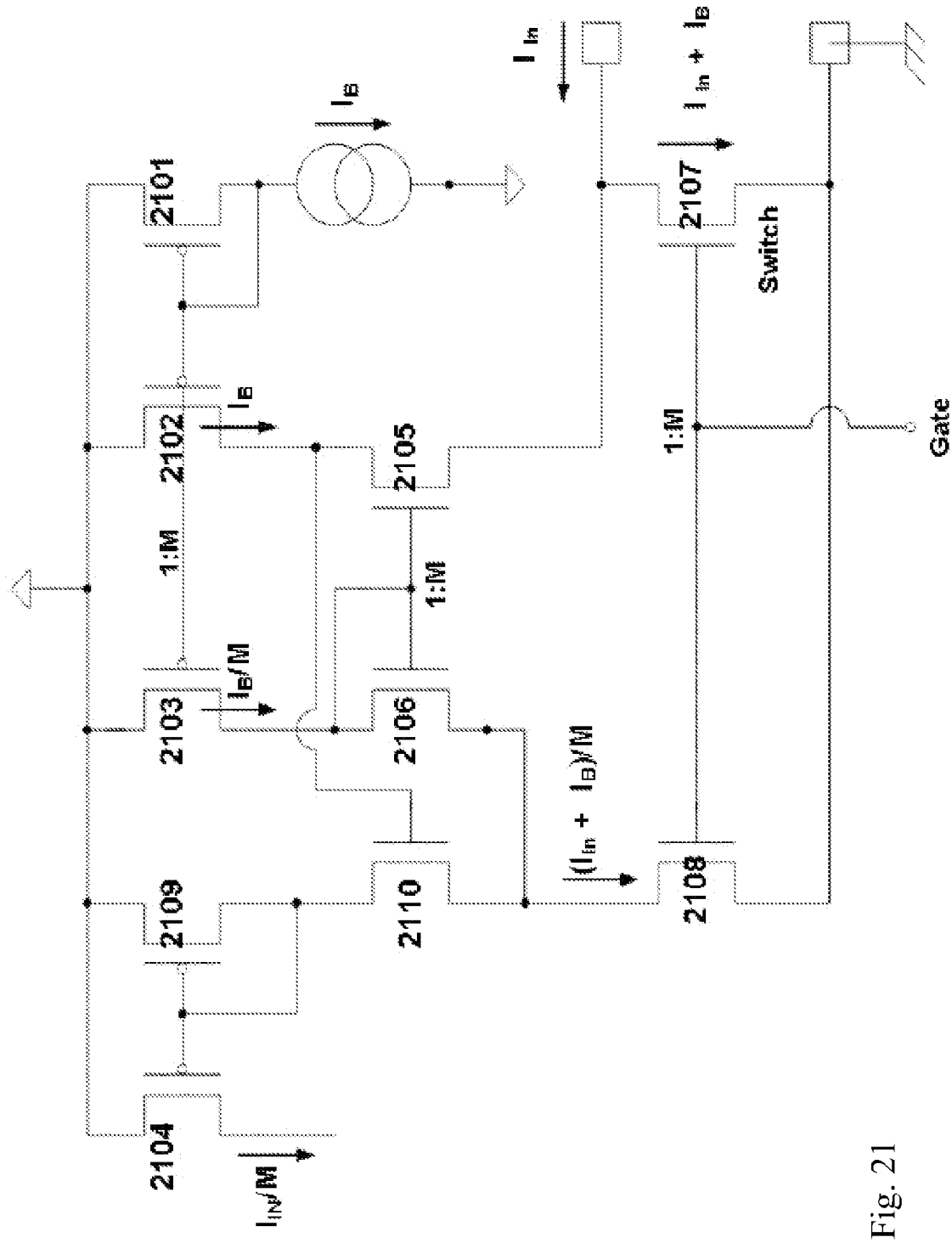
FIG. 21 shows yet another embodiment of a switch and current monitoring apparatus according to the present invention.

FIG. 21, shows yet another current mirror that combines the advantages of the two previous structures: it is both small and precise enough to be used in PD (powered devices). The common gate differential structure consisting of transistors 2106 and 2105 compares the voltages at the drain of transistors 2107 (the switch). By using the sources of these transistors as input instead of the gates, it simplifies the circuitry while guaranteeing that the circuit will still operate even if the voltage on the farin of transistors 2108 and 2107 is very close to ground.

The cascode transistor 2110 is driven at its gate by the output of the common gate differential structure (i.e. the drain of transistor 2105) and forces the drain voltage of transistor 2108 to be equal to the drain voltage of transistor 2107.

The current flowing through the cascode transistor 2110 is equal to $I_{in}/M$ and is mirrored by transistors 2109 and 2104.

The transistors 2102 and 2103, 2106 and 2105, 2107 and 2108 respectively are in a 1/M ratio.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. One or more features of any aspect of the invention may be combined. All changes which come within the meaning and range of equivalency of the claims are to be embraced within their scope.

What is claimed is:

1. A power supply apparatus, comprising:
a substrate;
at least one power switch mounted on, or integrated with, the substrate, the power switch comprising:
a first temperature sensor configured to sense a local temperature of the power switch; and
a first controller configured to variably control current through the power switch based on the locally sensed temperature;
a second temperature sensor positioned on the substrate and configured to sense an overall temperature of the substrate; and
a second controller, responsive to the second temperature sensor, configured to control current flow through the power switch and configured, to control DC-DC converter.

2. The power supply apparatus according to claim 1, wherein the first controller is arranged to regulate the current flow through the power switch responsive to the second temperature sensor.

3. The power supply apparatus according to claim 1, wherein the second temperature sensor is positioned substantially centrally on the substrate.

4. A Power Sourcing Equipment (PSE) device configured for use in a Power over Ethernet (PoE) system, comprising the power supply apparatus according to claim 1.

5. A powered device, comprising the power supply apparatus according to claim 1.

6. The power supply apparatus according to claim 1, wherein:
the first controller is configured to variably control current through the power switch to be one of at least two non-zero values, wherein the first controller is configured to select the current based on the locally sensed temperature.

7. The power supply apparatus according to claim 6, wherein the substrate is a semiconductor substrate.

8. The power supply apparatus according to claim 6, wherein the first temperature sensor further comprises a diode, and is configured to sense the local temperature of the power switch by measuring a voltage drop of the diode when a reference current passes through the diode.

9. A network-attached device comprising the power supply apparatus of claim 6.

10. A power over Ethernet device comprising the power supply apparatus of claim 6.

11. The power supply apparatus of claim 6, wherein the first controller is configured to select the current to be zero based on the locally sensed temperature.

12. The power supply apparatus of claim 6, wherein the first controller is configured to decrease the current to a non-zero current value when the locally sensed temperature exceeds a temperature threshold.

13. The power supply apparatus of claim 6, wherein the first controller is configured to:

decrease the current to a first current threshold when the locally sensed temperature exceeds a first temperature threshold; and decrease the current to a second current threshold when the locally sensed temperature exceeds a second temperature threshold.

14. A switch, comprising:

a first temperature sensor configured to sense a temperature of the switch;

a controller configured to variably control current through the switch based on the temperature of the switch;

a substrate, wherein the temperature sensor and the controller are positioned on the substrate;

a second temperature sensor positioned on the substrate and configured to sense a second temperature; and a second controller, configured to control current flow through the switch based on the second temperature and is configured to control a DC-DC converter.

15. The switch of claim 14, wherein the second temperature sensor is positioned substantially centrally on the substrate.

16. The switch of claim 14, wherein the first controller is configured to control current flow through the switch based on the second temperature.

* * * * *

UNITED STATES PATENT AND TRADEMARK OFFICE
CERTIFICATE OF CORRECTION

PATENT NO.      : 8,582,266 B2
APPLICATION NO. : 11/676252
DATED           : November 12, 2013
INVENTOR(S)     : Bertin et al.

It is certified that error appears in the above-identified patent and that said Letters Patent is hereby corrected as shown below:

In the Claims

Claim 1, Column 22, line 27, the "," after "configured" should be deleted.
Claim 1, Column 22, line 27, "control DC-DC" should be replaced with --control a DC-DC--.

Signed and Sealed this
First Day of July, 2014

Michelle K. Lee
*Deputy Director of the United States Patent and Trademark Office*